United States Patent
Nishizono

(10) Patent No.: US 6,867,623 B2
(45) Date of Patent: Mar. 15, 2005

(54) RECEIVING CIRCUIT

(75) Inventor: Kazunori Nishizono, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/278,902

(22) Filed: Oct. 24, 2002

(65) Prior Publication Data

US 2003/0098724 A1 May 29, 2003

(30) Foreign Application Priority Data

Nov. 27, 2001 (JP) ........................................ 2001-361298

(51) Int. Cl.$^7$ ............................................. H03K 5/153
(52) U.S. Cl. ........................... 327/78; 327/77; 327/291; 327/561
(58) Field of Search ............................. 327/58, 18, 20, 327/77, 78, 291, 333, 560, 561

(56) References Cited

U.S. PATENT DOCUMENTS

| | | | | |
|---|---|---|---|---|
| 4,772,830 A | * | 9/1988 | Kobari et al. | 318/563 |
| 4,789,836 A | * | 12/1988 | May | 327/70 |
| 5,382,848 A | * | 1/1995 | Burns et al. | 327/18 |
| 6,377,082 B1 | * | 4/2002 | Loinaz et al. | 327/20 |
| 2003/0117117 A1 | * | 6/2003 | Zinn et al. | 323/273 |

* cited by examiner

Primary Examiner—Terry D. Cunningham
(74) Attorney, Agent, or Firm—Arent Fox PLLC

(57) ABSTRACT

A receiving circuit including an amplifier for generating a receiving voltage signal, a comparator for generating a binary signal from the receiving voltage signal, and a logic maintaining circuit for receiving the binary signal and maintaining the binary signal at a shifted level for a predetermined period after the level of the binary signal is shifted. The logic maintaining circuit prevents noise pulses from appearing in a receiving signal.

22 Claims, 20 Drawing Sheets

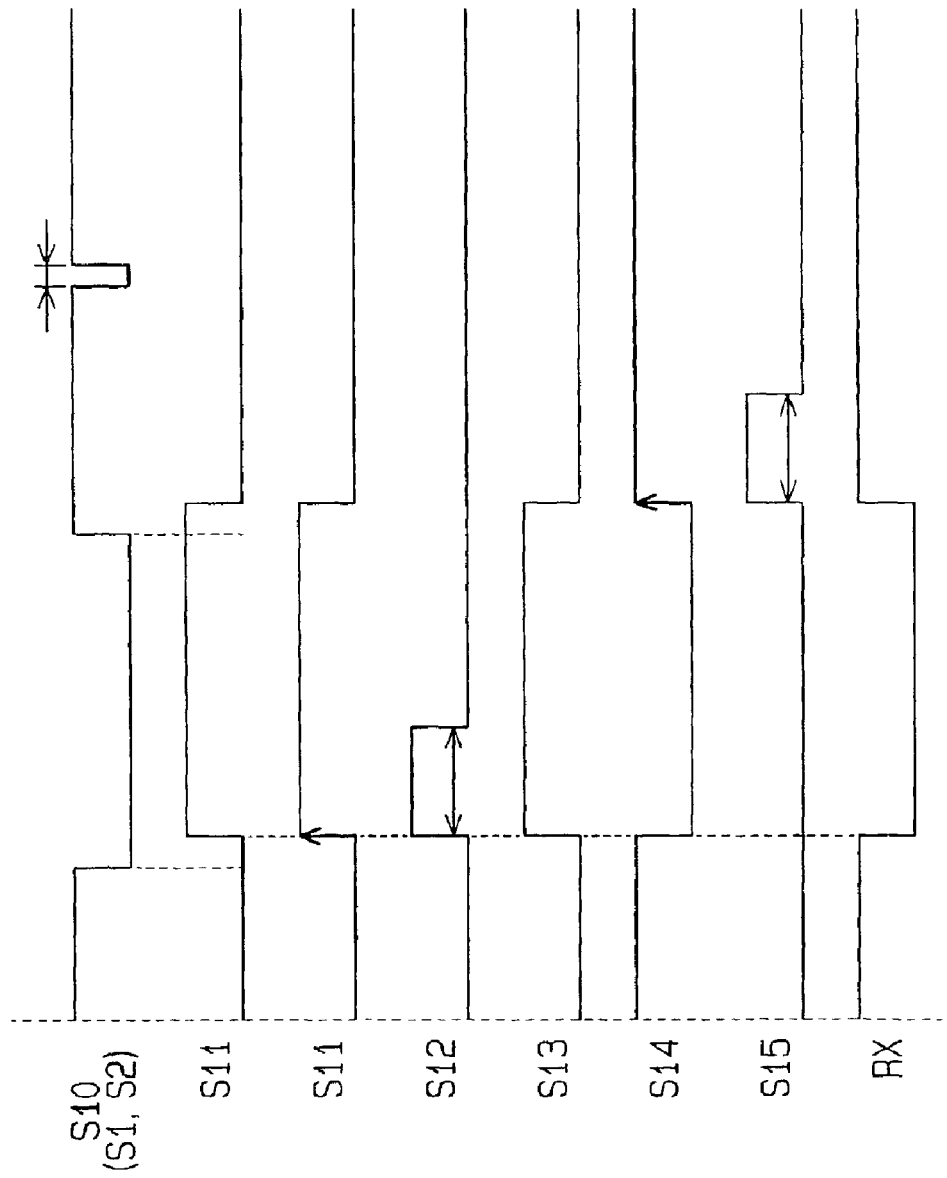

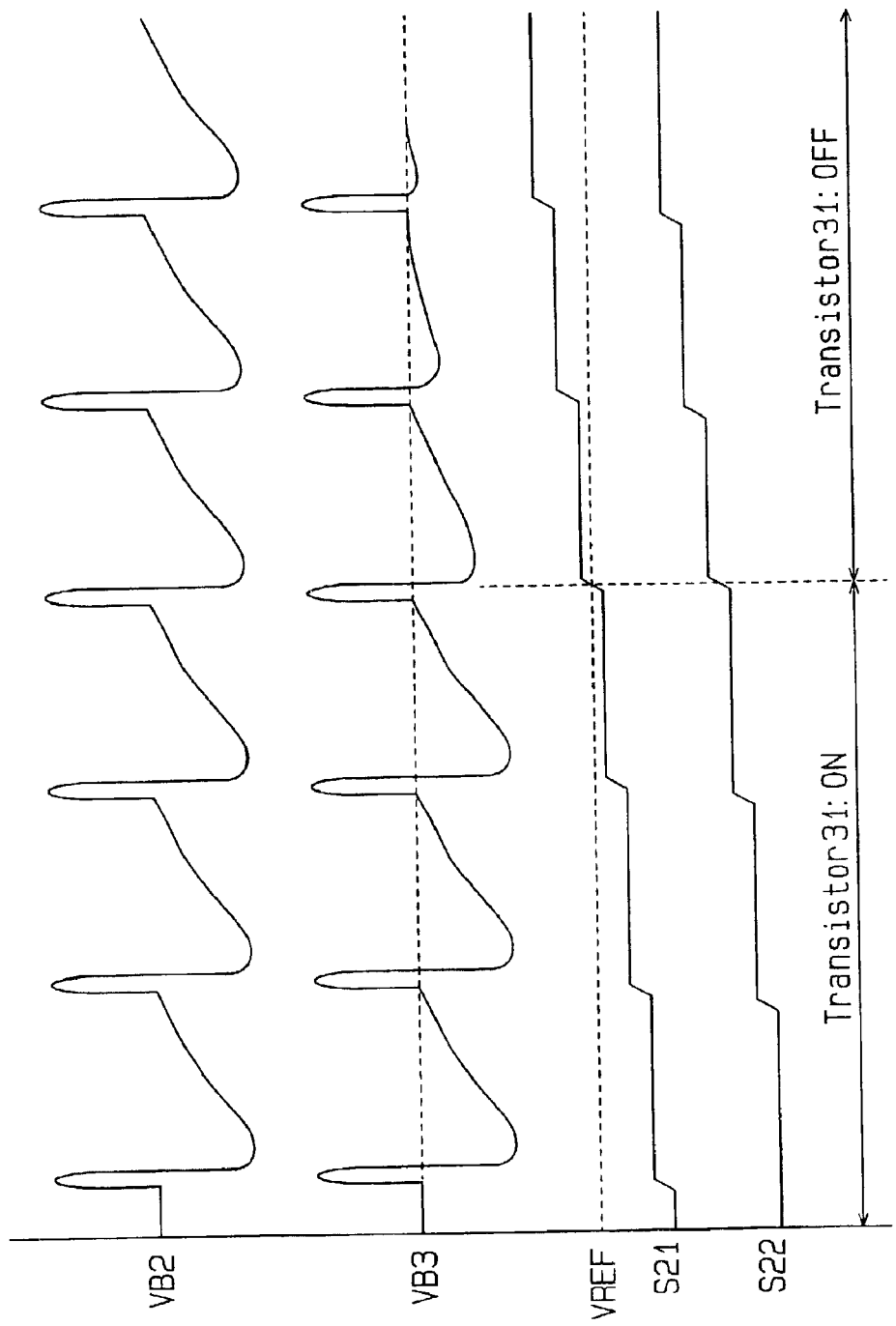

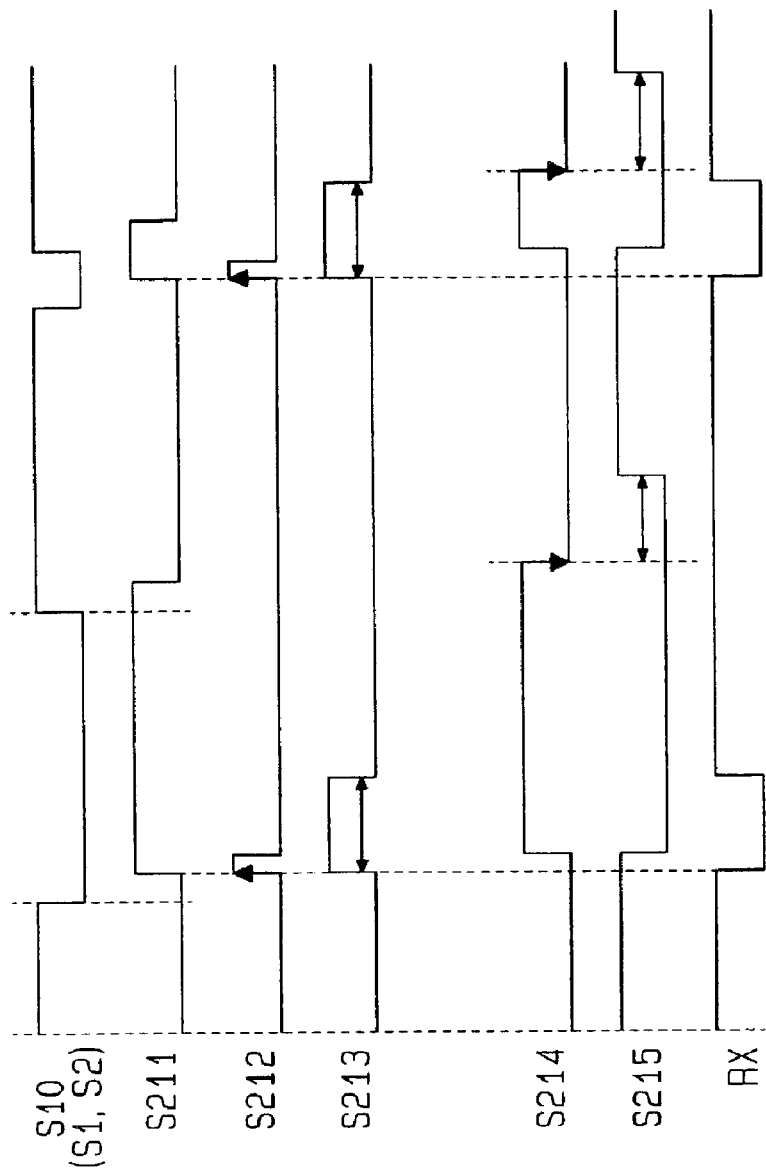

RECEIVING CIRCUIT

BACKGROUND OF THE INVENTION

The present invention relates to a receiving circuit, and more particularly, to a receiving circuit of an infrared data communication apparatus for a portable terminal, such as a personal digital assistant (PDA), or an electronic device, such a as a cellular phone.

FIG. 1 is a schematic block diagram of a prior art receiving circuit 10, which is employed in an optical communication apparatus.

The receiving circuit 10 includes a photodiode (PD) 11 and a light receiving amplifier 12. The light receiving amplifier 12 includes a preamplifier 13, a main amplifier 14, a comparator 15, a DC light cancel circuit 16, and a DC feedback (DCFB) circuit 17.

The photodiode 11 generates a receiving current IPD, which corresponds to the received light. The preamplifier 13 coverts the receiving current IPD to a voltage signal VA1. The main amplifier 14 amplifies the voltage signal VA1 and generates an amplified signal VA2. The comparator 15 generates a binary receiving signal RX from the amplified signal VA2 based on a threshold value voltage VTH.

The received light may include DC light, such as sunlight. DC light generates a direct current (DC) component of the receiving current IPD, which flows through the photodiode 11. The DC component has a frequency, which is lower than a predetermined frequency band that includes a communication frequency. The DC light cancel circuit 16 feeds back the receiving current IPD, or the current for canceling the DC component included in the voltage signal, to the preamplifier 13.

The DCFB circuit 17 is used to cancel the input offset of the main amplifier 14. The DCFB circuit 17 has a plus input terminal, to which the amplified signal VA2 of the main amplifier is applied, and a minus input terminal VA2, to which a reference voltage VREF is applied. The output terminal of the DCFB circuit 17 is connected to the minus input terminal of the main amplifier 14. The voltage signal VA1 is applied to the plus input terminal of the main amplifier 14. The reference voltage VREF is provided to the minus input terminal of the main amplifier 14 via a resistor RB. The DCFB circuit 17 generates current, which corresponds to the potential difference between the amplified signal VA2 and the reference voltage VREF. The output current of the DCFB circuit 17, the reference voltage VREF, and the resistance of the resistor RB determines the voltage that is supplied to the minus input terminal of the main amplifier 14. The DCFB circuit 17 outputs current so that the DC component of the voltage signal VA1 of the main amplifier 14 coincides with the voltage supplied to the minus input terminal. That is, the DCFB circuit 17 cancels the input offset voltage in the main amplifier 14.

The prior art light receiving amplifier 12 has the four shortcomings that are described below.

(1) The occurrence of an input/output wraparound phenomenon of the light receiving amplifier 12 results in erroneous functioning. The wraparound phenomenon occurs directly or through a power supply line between the digital output and analog input of the light receiving amplifier 12 and produces noise in the light receiving signal RX. The noise causes erroneous functioning in an internal circuit of the optical communication apparatus.

As shown in FIG. 2(a), the level of the receiving signal RX normally changes in accordance with a light input signal. As shown in FIG. 2(b), when the input/output wraparound phenomenon occurs, a spike current is generated if the level of the light receiving signal RX changes. The spike current acts as a switching noise and affects the input terminal or the PD 11. Thus, the amplified signal VA2 of the comparator 15 includes noise and unnecessary pulses (the pulses encircled by the dotted lines) that appear in the receiving signal RX. Further, in some cases, the input/output wraparound phenomenon may cause oscillation.

(2) A differential amplifier having a high gain is employed as the main amplifier 14. However, the input offset of the high gain amplifier is not uniform. Thus, as described above, the DCFB circuit 17 is provided to feed back the DC component and cancel the input offset of the main amplifier 14. However, the amount of feedback of the DCFB circuit 17 is easily changed in accordance with the level of the voltage signal VA1 in the main amplifier 14 or the duty ratio of the main amplifier 14.

(3) When using a device incorporating the optical communication apparatus outdoor, the DC components included in the receiving circuit IPD increases. This increases the amount of the DC components cancelled by the DC light cancel circuit 16 and increases noise. This decreases the receiving sensitivity.

(4) When optical communication is performed at a close distance, a large amount of light is irradiated to the PD 11. This causes the generated receiving signal RX to have a pulse width that does not comply with the regulated standard (i.e., the pulse width is greater than the regulated width).

SUMMARY OF THE INVENTION

The present invention provides a receiving circuit including an amplifier for generating a receiving voltage signal. A comparator generates a binary signal with the receiving voltage signal. A logic maintaining circuit receives the binary signal and maintains the binary signal at a shifted level for a predetermined period after the level of the binary signal is shifted.

In a further perspective of the present invention, a receiving circuit includes a first amplifier for converting a receiving current signal to a receiving voltage signal. A second amplifier is connected to the first amplifier to amplify the receiving voltage signal and generate a first amplified signal. A comparator is connected to the second amplifier to generate a receiving signal from the first amplified signal. An amplitude restriction circuit is connected to the second amplifier to generate a second amplified signal or a rectified signal in accordance with the level of the first amplified signal. A feedback circuit is connected between the second amplifier and the amplitude restriction circuit to generate a feedback signal that is fed back to the second amplifier based on the second amplified signal or the rectified signal.

In a further perspective of the present invention, a receiving circuit includes a first amplifier for converting a receiving current signal to a receiving voltage signal. A second amplifier is connected to the first amplifier to amplify the receiving voltage signal and generate an amplified signal. A comparator is connected to the second amplifier to generate a first receiving signal from the amplified signal. A clamp detection circuit generates a second receiving signal having a pulse corresponding to current that flows through the first amplifier. A pulse synthesizing circuit is connected to the comparator and the clamp detection circuit to synthesize the first receiving signal and the second receiving signal and generate a third receiving signal.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 6 is a waveform chart illustrating the operation of the logic maintaining circuit of FIG. 5;

FIG. 11 is a waveform chart illustrating the operation of the amplitude restriction circuit of FIG. 10;

FIG. 23 is a waveform chart illustrating the operation of the logic maintaining circuit of FIG. 22.

DETAILED DESCRIPTION OF THE PREFERRED EMBODIMENTS

Figure 1:
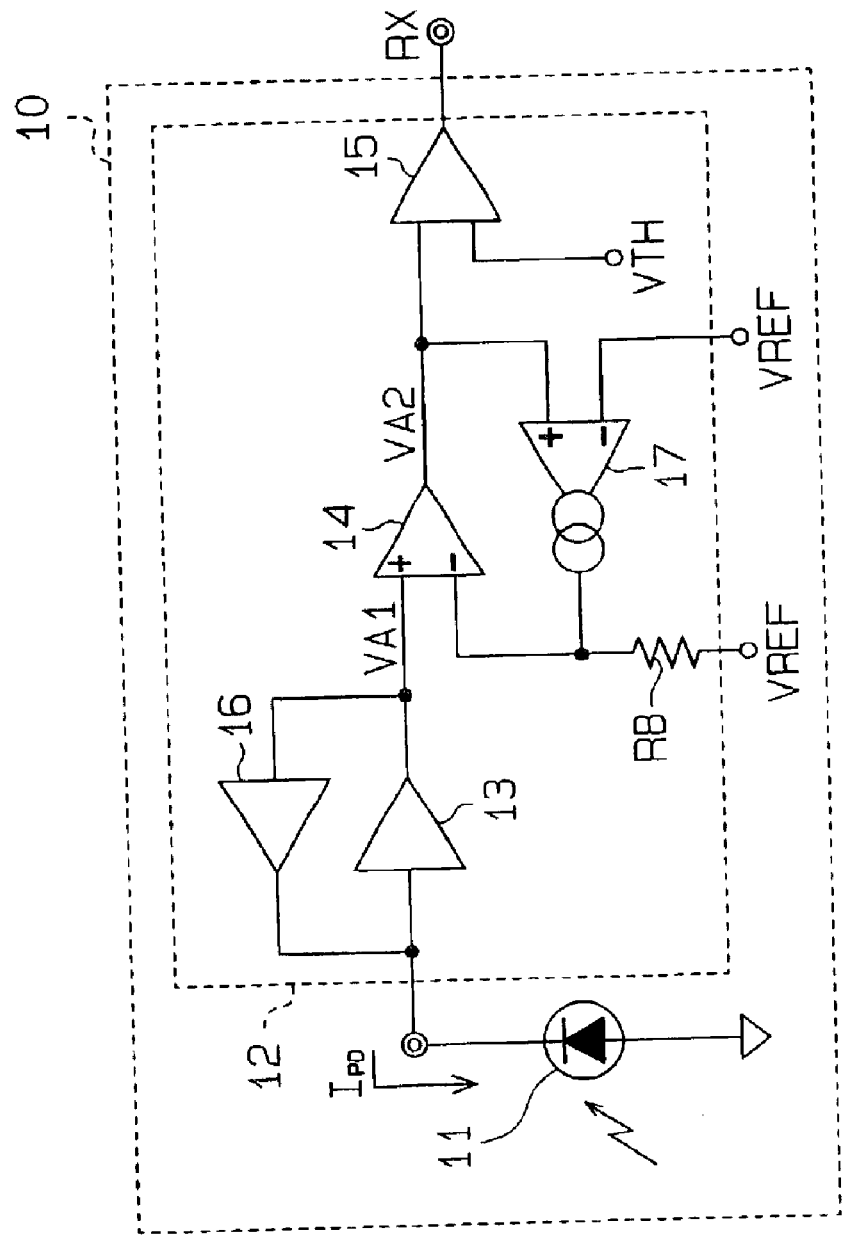
FIG. 1 is a circuit diagram of a prior art light receiving amplifier.
Figure 2A:
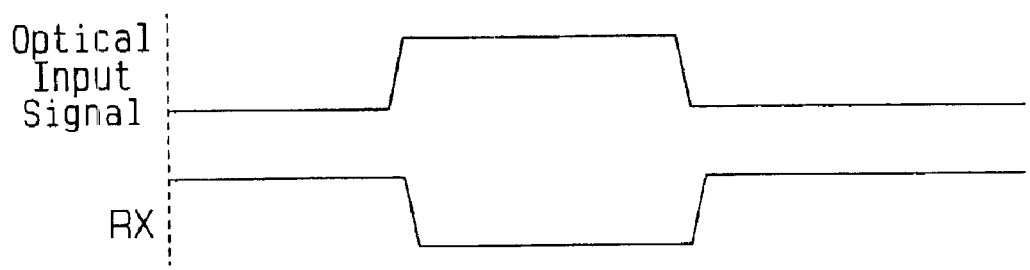
FIGS. 2(a) and 2(b) are waveform charts illustrating the operation of the light receiving amplifier.
Figure 2B:
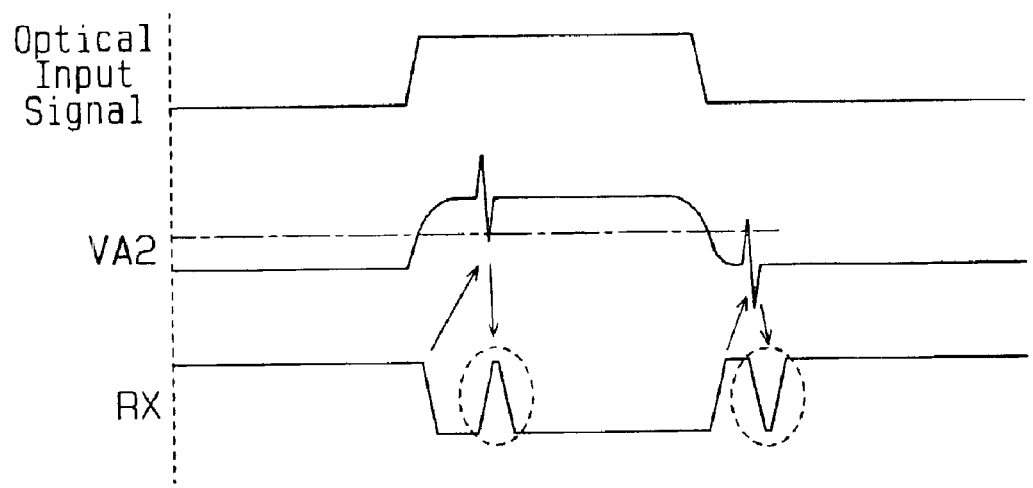

In the drawings, like numerals are used for like elements throughout.

Figure 3:
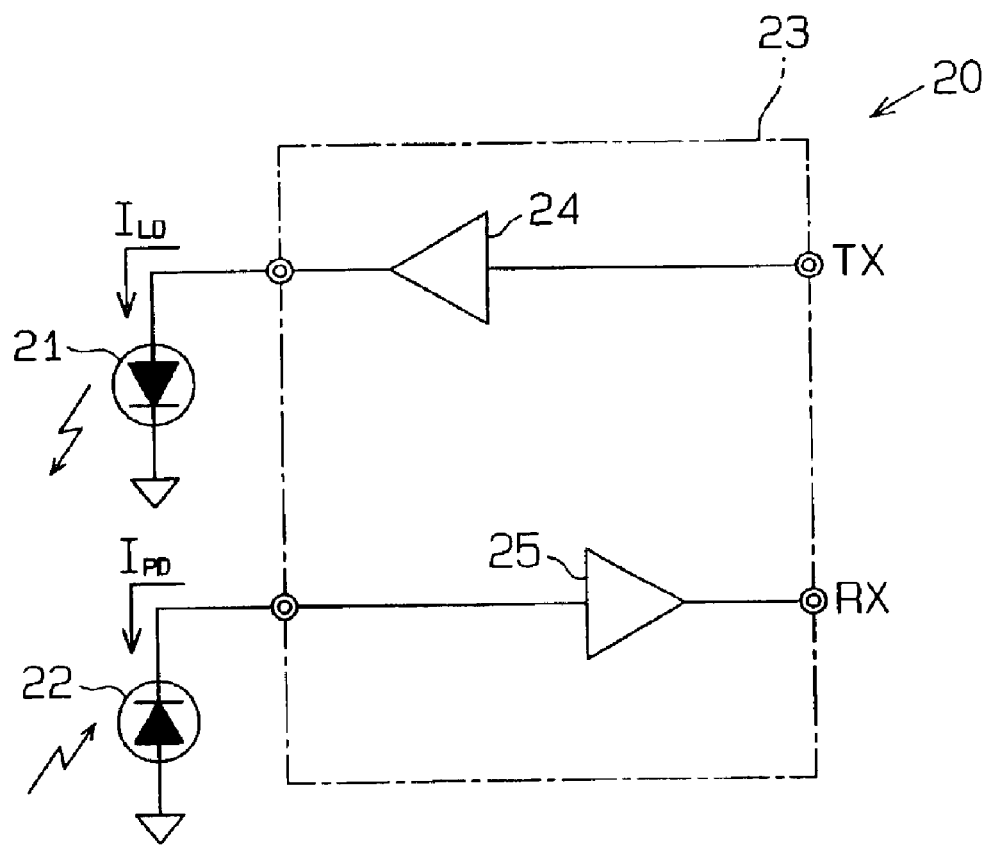
FIG. 3 is a schematic block diagram of an optical communication apparatus according to a preferred embodiment of the present invention.

FIG. 3 is a schematic block diagram of an optical communication apparatus 20 according to a preferred embodiment of the present invention. The optical communication apparatus 20 includes a light-emitting diode 21, a photodiode 22, and a transceiver circuit 23. The transceiver circuit 23 includes a light transmitting amplifier 24 and a light receiving amplifier 25.

The transmitting amplifier 24 has an output terminal, which is connected to the light-emitting diode 21, and an input terminal, which receives a transmitting signal TX. The light transmitting amplifier 24 generates a pulse-like transmitting current ILD in accordance with the transmitting signal TX and supplies the transmitting current ILD to the light-emitting diode 21. The light-emitting diode 21 goes on and off in accordance with transmitting current ILD.

The receiving amplifier 25 has an input terminal, which is connected to the photodiode 22. The photodiode 22 generates a receiving current IPD, which is in accordance with the received light. The light receiving amplifier 25 performs current-voltage (I-V) conversion on the receiving current IPD and binarizes a receiving voltage to generate a digital receiving signal RX.

Figure 4:
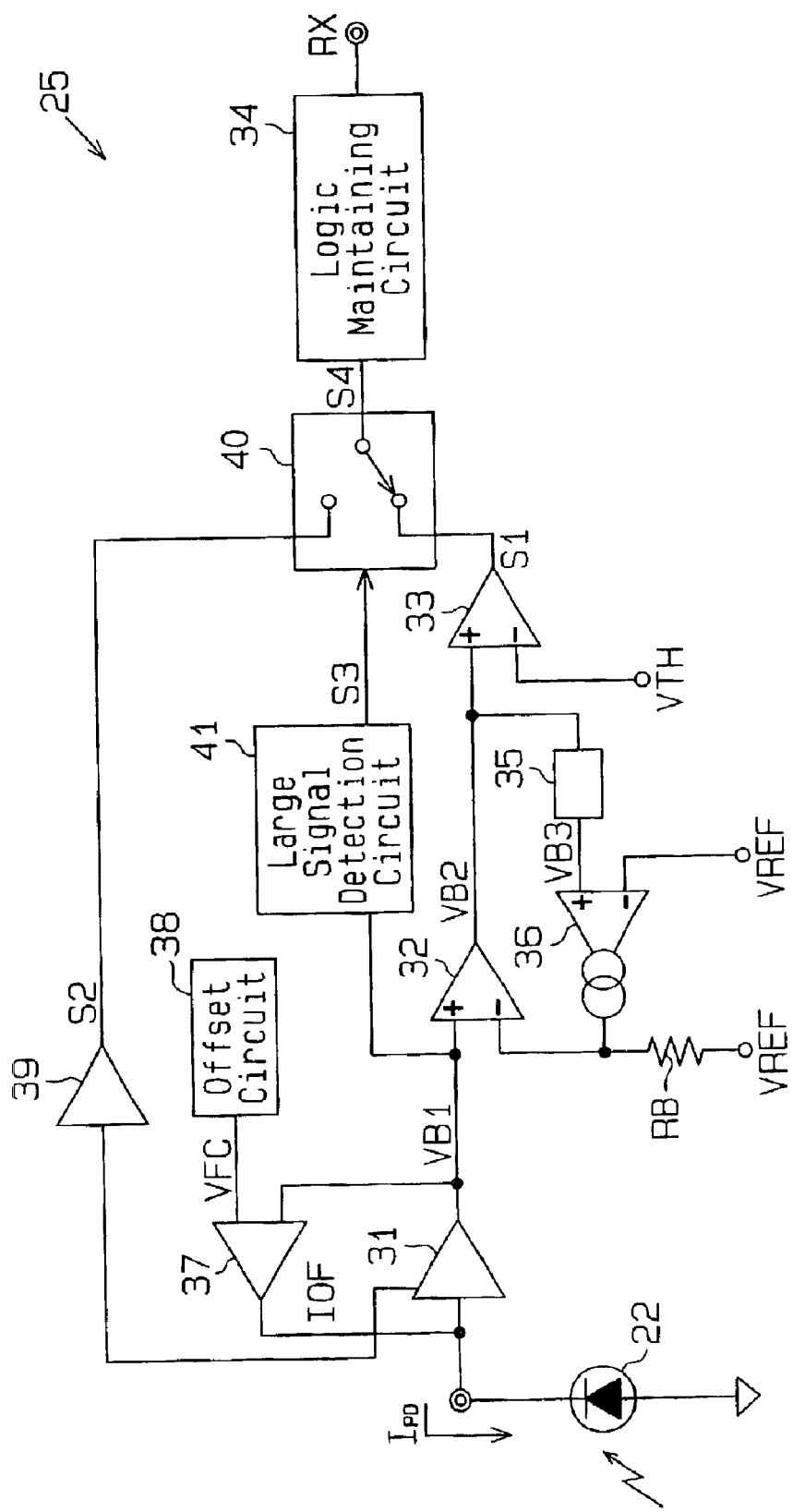
FIG. 4 is a schematic block diagram of a light receiving amplifier incorporated in the optical communication apparatus of FIG. 3.

FIG. 4 is a schematic block diagram of the light receiving amplifier 25. The light receiving amplifier 25 includes a preamplifier 31 functioning as a first amplifier, a main amplifier 32 functioning as a second amplifier, a comparator 33, a logic maintaining circuit 34, an amplitude restriction circuit 35, a DC feedback (DCFB) circuit 36, a DC light cancel circuit 37, an offset circuit 38, a clamp detection circuit 39, a pulse synthesizing circuit 40, and a large signal detection circuit 41.

The preamplifier 31 receives the receiving current IPD from the photodiode 22 and performs current-voltage (I-V) conversion on the receiving current IPD to generate a voltage signal VB1.

The main amplifier 32 amplifies the voltage signal VB1 to generate an amplified signal VB2. The comparator 33 generates a binary first receiving signal S1 from the amplified signal VB2 of the main amplifier 32 in accordance with a threshold value voltage VTH.

The logic maintaining circuit 34 performs waveform processing on the first receiving signal S1 to generate a receiving signal RX. Further, the logic maintaining circuit 34 maintains the logic level of the receiving signal RX for a predetermined period. Accordingly, noise does not affect the receiving signal during the logic-maintained period.

More specifically, the logic maintaining circuit 34 shifts the level of the receiving signal RX in accordance with the shift of the first receiving signal S1. Further, the logic maintaining circuit 34 holds the logic level of the receiving signal RX at the determined level for a predetermined period from when the level shifts. The predetermined period is longer than an unnecessary pulse generation period after the receiving signal RX shifts. Accordingly, even if the shifting of the receiving signal RX produces a switching noise, unnecessary pulses do not appear in the receiving signal RX since the logic level of the receiving signal RX is maintained by the logic maintaining circuit 34.

The amplitude restriction circuit 35 and the DCFB circuit 36 are connected between the input terminal and output terminal of the main amplifier 32 to cancel the input offset of the main amplifier 32.

The amplitude restriction circuit 35 suppresses fluctuation of the feedback amount resulting from the level and duty ratio of the input signal. The amplitude restriction circuit 35 has a rectifying function and a peak-hold function, peak-holds the amplified signal VB2 of the main amplifier 32, and changes the characteristic of the rectifying function in accordance with the peak-held voltage level.

More specifically, the amplitude restriction circuit 35 compares the level of the reference voltage VREF, which is supplied to the DCFB circuit 36, with the peak-held voltage of the amplified signal VB2. When the peak-held voltage level is lower than the reference voltage VREF, the amplitude restriction circuit 35 generates an amplified signal VB3, the waveform of which is substantially the same as the amplified signal VB2. When the peak-held voltage level is greater than the reference voltage VREF, the amplitude restriction circuit 35 rectifies the amplified signal VB2 and generates a rectified signal or an amplification restriction signal VB3. The amplification restriction signal VB3 is a signal from which the minus voltage of the amplified signal VB2 is clipped.

The DCFB circuit 36 has a plus input terminal for receiving the amplified signal or the amplitude restriction signal VB3, a minus input terminal for receiving the reference voltage VREF, and an output terminal connected to the minus input terminal of the main amplifier 32. The minus input terminal of the main amplifier 32 is provided with the reference voltage VREF via the resistor RB.

The DCFB circuit 36 compares the signal VB3 and the reference voltage VREF to generate current that is in accordance with the potential difference between the signal VB3 and the reference voltage VREF. In this manner, when the amplitude of the amplified signal VB2 of the main amplifier 32 is large, the voltage level of the amplified signal VB2 is clipped to provide the generated amplitude restriction signal VB3 to the DCFB circuit 36. Accordingly, the level and duty ratio of the voltage signal VB1 suppresses fluctuation of the feedback amount of the DCFB circuit and prevents erroneous functioning of the main amplifier 32.

The DC light cancel circuit 37 is connected between the input terminal and output terminal of the preamplifier 31. More specifically, the DC light cancel circuit 37 has a minus input terminal for receiving the voltage signal VB1 from the preamplifier 31, a plus input terminal connected to the offset circuit 38, and an output terminal connected to the input terminal of the preamplifier 31.

The DC light cancel circuit 37 generates current IOF that is in accordance with the potential difference between the plus input terminal and the minus input terminal and supplies the current IOF to the input terminal of the preamplifier 31.

The offset circuit 38 provides the DC light cancel circuit 37 with a voltage signal VFC that offsets a differential input of the DC light cancel circuit 37.

The offset amount of the offset circuit 38 corresponds to the direct current (DC) component that does not saturate the preamplifier 31. The DC component includes frequency components that are sufficiently lower that the frequency band of the signals handled by the optical communication apparatus 20. Further, the DC component (offset amount) is greater than the DC component of the current IPD that flows through the photodiode when using a portable device incorporating the optical communication apparatus 20 indoor.

The DC light cancel circuit 37 does not function until a DC component corresponding to the received offset is produced (i.e., until the DC component is provided to the preamplifier 31). In other words, the DC light cancel circuit does not cancel the DC component until the DC component generated in the photodiode 22 becomes substantially equal to the current amount corresponding to the offset amount. Thus, the amount of noise in the receiving current is extremely small.

The preamplifier 31 has a clamp circuit (not shown), which prevents the input voltage of the preamplifier 31 from decreasing and saturating the preamplifier 31 when a large current flows through the preamplifier 31. The clamp detection circuit 39 detects the state of the clamp circuit of the preamplifier 31 and generates a second receiving signal S2, the pulse width of which corresponds to the current flowing through the clamp circuit.

The pulse synthesizing circuit 40 receives the first receiving signal S1 from the comparator 33, the second receiving signal S2 from the clamp detection circuit 39, and the detection signal S3 from a large signal detection circuit 41.

The large signal detection circuit 41 receives the voltage signal VB1 of the preamplifier 31, detects whether the voltage signal VB1 is a relatively large signal or a relatively small signal, and generates the detection signal S3 in accordance with the detection result.

The pulse synthesizing circuit 40 synthesizes the first receiving signal S1 and the second receiving signal S2 in response to the detection signal S3 to generate a synthesized signal (third receiving signal) S4. More specifically, in response to the detection signal S3 that has a first level (e.g., low level), the pulse synthesizing circuit 40 generates the synthesized signal S4, the pulse width of which is substantially the same as the pulse width of the first receiving signal S1. In response to the detection signal S3 that has a second level (e.g., high level), the pulse synthesizing circuit 40 generates the synthesized signal S4, the pulse width of which is substantially the same as the pulse width of the second receiving signal S2.

The current that flows through the clamp circuit of the preamplifier 31 is subtly affected by the input current of the preamplifier 31. Further, the trailing component of the current is small. Accordingly, the second receiving signal S2 of the clamp detection circuit 39 has substantially the same pulse width as the current signal flowing through the clamp circuit (i.e., the light receiving pulse of the photodiode 22). In comparison, the voltage signal VB1 of the preamplifier 31 is easily affected by the input current. The voltage signal VB1 functions as an element that widens the pulse width of the receiving signal RX. That is, the first receiving signal S1 is generated by the comparator 33 based on the voltage signal VB1 of the preamplifier 31. Thus, the pulse width of the first receiving signal S1 varies in accordance with the input current of the preamplifier 31 (i.e., the light receiving amount of the photodiode 22). Accordingly, the first receiving signal S1 has a pulse width that complies with the required standards when the light receiving amount of the photodiode 22 is small. The pulse width of the first receiving signal S1 does not comply with the standards when the light receiving amount of the photodiode 22 is large.

The large signal detection circuit 41 controls the pulse synthesizing circuit 40 to output the first receiving signal S1 when the light receiving amount of the photodiode 22 is relatively small. When the light receiving amount of the photodiode 22 is relatively large, the large signal detection circuit 41 controls the pulse synthesizing circuit 40 to output the second receiving signal S2, which is generated by the clamp detection circuit 39. Such control generates the receiving signal RX so that it has the pulse width required by standards regardless of whether the light receiving amount of the photodiode is small or large.

Figure 5:
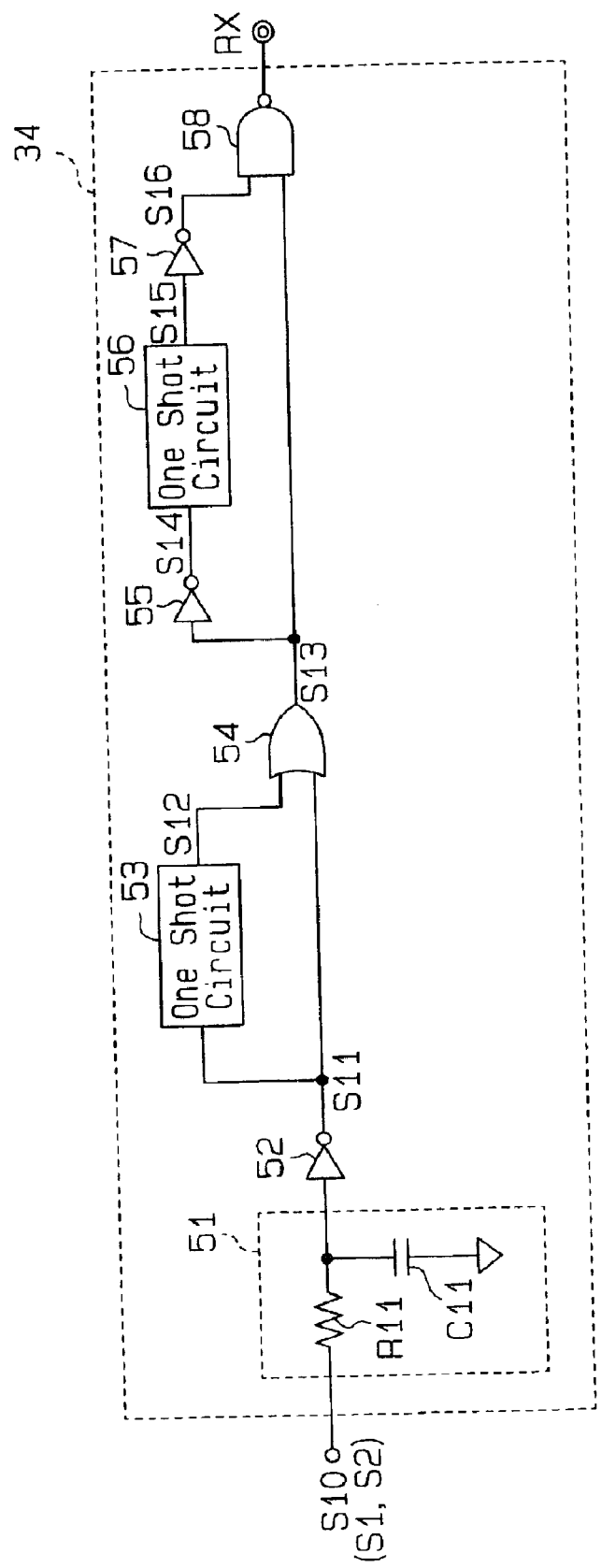
FIG. 5 is a circuit diagram of a logic maintaining circuit incorporated in the light receiving amplifier of FIG. 4.

FIG. 5 is a circuit diagram of the logic maintaining circuit 34. The logic maintaining circuit 34 includes an integration circuit 51, inverter circuits 52, 55, 57, one shot circuits 53, 56, an OR circuit 54, and a NAND circuit 58.

The integration circuit 51 is provided with the output signal S10 of the pulse synthesizing circuit 40. The integration circuit 51 includes a resistor R11 and a capacitor C11. The accumulated voltage of the capacitor C11 increases or decreases in accordance with a time constant determined by the resistance of the register R11 and the capacitance of the capacitor C11. When the accumulated voltage of the capacitor C11 exceeds the threshold voltage value of the inverter circuit 52, the inverter circuit 52 generates an inverted signal S11. As a result, the inverted signal S11 is delayed from the output signal S10 by a time determined by the resistance of the resistor R11 and the capacitance of the capacitor C11.

The first one shot circuit 53 receives the inverted signal S11 from the first inverter circuit 52 and generates a one shot signal S12, which has a predetermined pulse width and a predetermined level, in response to the rising edge (up edge trigger) of the inverted signal S11. The one shot signal S12 has substantially the same level as the inverted signal S11.

The OR circuit 54 receives the inverted signal S11 of the first inverter circuit 52 and the one shot signal S12 of the first one shot circuit 53 to generate an OR signal S13 of the inverted signal S11 and the one shot signal S12.

The second inverter circuit 55 provides the inverted signal S14 of the OR signal S13 of the OR circuit 54 to the second one shot circuit 56. In response to the rising edge (up edge trigger) of the inverted signal S14, the second one shot circuit 56 generates a one shot signal S15, which has a predetermined pulse width and a predetermined level. The one shot signal S15 has substantially the same level as the inverted signal S14.

The third inverter circuit 57 provides the inverted signal S16 of the one shot signal S15 to the NAND circuit 58. The NAND circuit 58 receives the OR signal S13 of the OR circuit 54 and the inverted signal S16 of the inverter circuit 57 to generate a receiving signal RX, which is a NAND signal of the OR signal S13 and the inverted signal S16.

The one shot signals S12, S15 each has a pulse width which is longer than the time from when a change in the input of the light receiving amplifier 25 appears in the receiving signal RX and is narrower than the required pulse width of the receiving signal RX.

FIG. 6 is a waveform diagram illustrating the operation of the logic maintaining circuit 34.

The integration circuit 51 eliminates pulses that are not required by the standards, such as noise. Such unregulated pulses have a pulse width that is narrower than the pulse width that is required for communication. That is, when the pulse width is narrow, the level of the output signal of the integration circuit 51 does not exceed the threshold value voltage of the first inverter circuit 52. Thus, the output signal S11 of the first inverter circuit 52 is not inverted. As a result, the receiving signal RX is not generated from the signal S10, which has the unregulated pulse width.

The OR signal S13, which is generated by synthesizing the inverted signal S11 and the one shot signal S12, is maintained at a predetermined level (high level in FIG. 6) for a predetermined period corresponding to at least the pulse width of the one shot signal S12.

The receiving signal RX, which is generated by synthesizing the OR signal S13 of the OR circuit with the inverted signal S16 of the one shot signal S15, is maintained at a predetermined level (low level in FIG. 6) for a predetermined period that corresponds to at least the pulse width of the one shot signal S15. Accordingly, by using the logic maintaining circuit 34, the logic level of the receiving signal RX is maintained at a predetermined level for a predetermined time after the receiving signal RX shifts. This prevents the generation of noise that is caused by the input/output wraparound phenomenon of the light receiving amplifier 12.

Figure 7A:
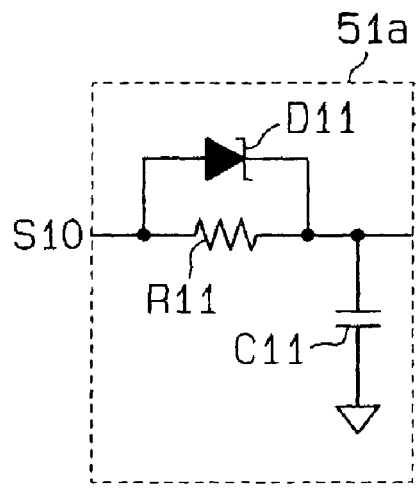
FIGS. 7(a) and 7(b) are circuit diagrams of an integration circuit employed in a further example of the logic maintaining circuit of FIG. 5.
Figure 7B:
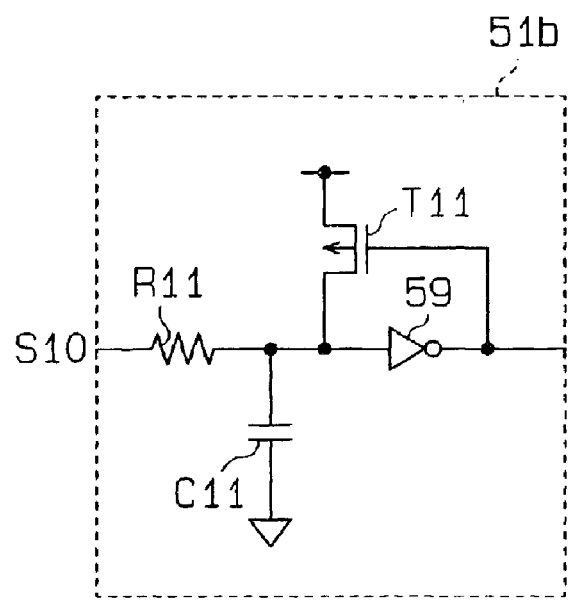

The logic maintaining circuit 34 may be changed as required. For example, the integration circuit 51 may be replaced by an integration circuit 51a, which is shown in FIG. 7(a), or by an integration circuit 51b, which is shown in FIG. 7(b).

The integration circuit 51a includes a resistor R11, a capacitor C11, and a Schottky barrier diode D11. The diode D11, which is connected parallel to the resistor R11, has an anode for receiving the signal S10 and a cathode connected to the capacitor C11.

The Schottky barrier diode D11 functions to give a hysteresis to the change in the accumulated voltage of the capacitor C11. When the input signal S10 goes low, the integration circuit 51a decreases the accumulated voltage of the capacitor C11 in accordance with a time constant that is determined by the resistance R11 of the resistor R11 and the capacitance of the capacitor C11. Further, when the input signal S10 goes high, the integration circuit 51a readily increases (resets) the accumulated voltage of the capacitor C11 to a predetermined potential. In this manner, the hysteresis prevents the logic maintaining circuit 34 from functioning erroneously.

Referring to FIG. 6, the time constant of the integration circuit 51a, which is determined by the resistor R11 and the capacitor C11, is set by eliminating a pulse that is more narrow than the regulated pulse. Accordingly, when the next pulse is provided before the accumulated voltage of the capacitor C11 becomes high enough, the accumulated voltage of the capacitor C11 at that time point decreases. As a result, the time from when the input signal S10 goes high to when the accumulated voltage exceeds the threshold value of the inverter circuit 52 becomes insufficient. In this case, it is impossible to eliminate a pulse that is more narrow than the regulated pulse. Accordingly, erroneous functioning of the logic maintaining circuit 34 is prevented by using the integration circuit 51a to readily increase the accumulated voltage of the capacitor C11 to the predetermined potential.

The integration circuit 51b includes a resistor R11, a capacitor C11, a p-channel MOS transistor T11, which is a switching device, and an inverter circuit 59. The inverter circuit 59, which receives the signal S10 via the resistor R11, includes an input terminal connected to a high potential power supply line via the transistor T11 and an output terminal connected to a control terminal of the transistor T11.

The p-channel MOS transistor T11 has the same function as the Schottky barrier diode D11 of FIG. 7(a). That is, the output signal of the inverter circuit 59 deactivates the transistor T11 when the accumulated voltage of the capacitor C11 decreases. When the accumulated voltage becomes greater than the threshold voltage value of the inverter circuit 59, the output signal of the inverter circuit 59 activates the transistor T11. As a result, the accumulated voltage of the capacitor C11 readily increases to the high potential power supply voltage.

Figure 8:
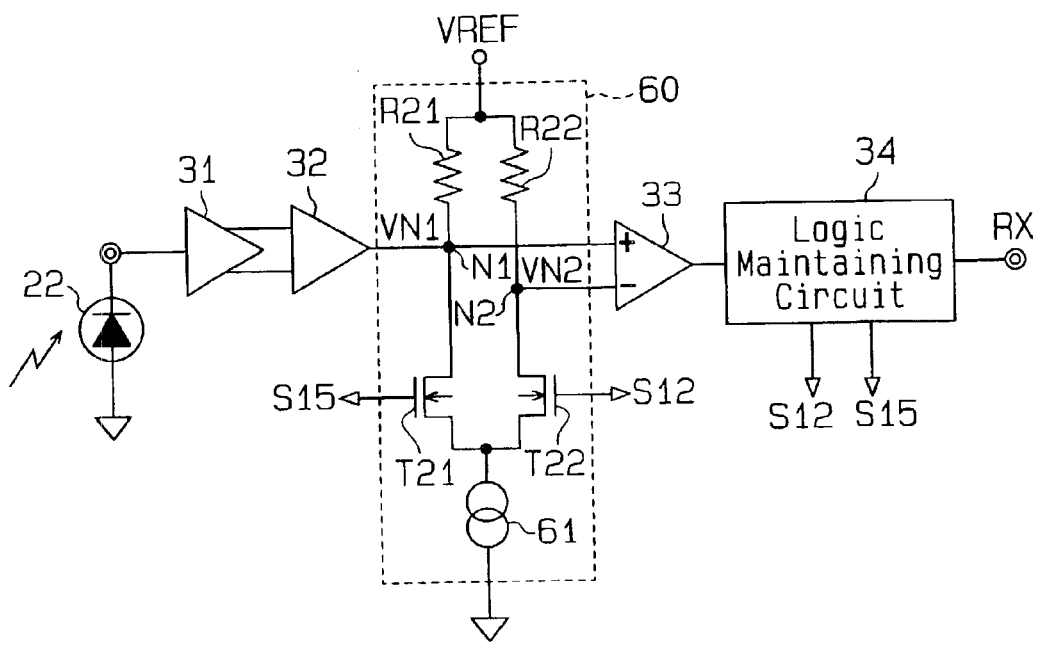
FIG. 8 is a circuit diagram of a light receiving amplifier that incorporates a hysteresis circuit.
Figure 9:
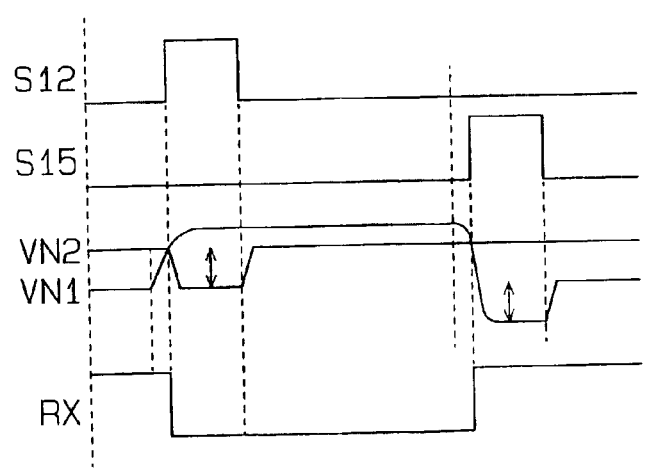
FIG. 9 is a waveform chart illustrating the operation of the hysteresis circuit of FIG. 8.

Referring to FIG. 8, for the input signal of the comparator 33 and the input signal of the main amplifier 32 to have hysteresis, the hysteresis circuit 60 may be connected between the main amplifier 32 and the comparator 33. FIG. 9 is a waveform diagram illustrating the operation of the hysteresis circuit 60.

The hysteresis circuit 60 includes resistors R21, R22, transistors T21, T22, which are current switches, and a current source 61. The resistors R21, R22 each have a first terminal connected to the reference voltage VREF. A second terminal of the resistor R21 is connected to the transistor T21, and a second terminal of the resistor R22 is connected to the transistor T22. The transistors T21, T22 are N-channel MOS transistors. The transistors T21, T22 have sources, which are connected to the current source, and drains respectively connected to the resistors R21, R22. The current source 61 is connected to a low potential power supply.

The one shot signal (second control signal) S15 of the second one shot circuit 56 in the logic maintaining circuit 34 is applied to the gate of the first transistor T21. The one shot signal (first control signal) S12 of the first one shot circuit 53 in the logic maintaining circuit 34 is applied to the gate of the second transistor T22.

A node N1 between the resistor R21 and the transistor T21 is connected to the plus input terminal of the comparator 33 (the output terminal of the main amplifier 32). A node N2 between the resistor R22 and the transistor T22 is connected to the minus input terminal of the comparator 33.

Referring to FIG. 9, when the first and second control signals S12, S15 are low and the first and second transistors T21, T22 are deactivated, the voltage VN2 at the second node N2 is substantially equal to the reference voltage VREF. When the photodiode 22 receives a signal light, the output voltage of the main amplifier 32 (the voltage VN1 at the first node N1) increases, and the logic maintaining circuit 34 generates the first control signal S12, which has a predetermined pulse width. The first control signal S12 activates the second transistor T22, and the voltage VN2 at the second node N2 is decreased by a potential corresponding to the current of the current source 61. The potential difference produced by the change in the voltage VN2 of the second node N2 is set as a hysteresis amount. That is, the potential difference between the plus input terminal and minus input terminal of the comparator 33 increases. The potential difference is greater than the amplitude of the noise produced when the level of the receiving signal RX shifts. As a result, the comparator 33 generates the first receiving signal S1, which is not affected by switching noise, and generates the receiving signal RX, which does not include noise pulses.

After a predetermined time (logic maintaining period) elapses, the first control signal S12, which has a low level, deactivates the second transistor T22, and the voltage VN2 at the second node N2 increases to the reference voltage VREF. Then, when the signal light goes off, the output voltage of the main amplifier 32 (the voltage VN1 at the first node N1) decreases, and the logic maintaining circuit 34 generates the second control signal S15, which has the predetermined pulse width. The second control signal S15 activates the first transistor T21, and the voltage VN2 at the second node N2 is further decreased from the base potential by a potential corresponding to the current of the current source 61. The base potential corresponds to the voltage at the second node N2 when the first and second control signals S12, S15 are both low. Accordingly, the potential difference between the plus input terminal and minus input terminal of the comparator 33 increases and becomes greater than the amplitude of the noise that is produced when the receiving signal RX shifts. As a result, the comparator 33 outputs the first receiving signal S1, which is not affected by switching noise, and generates the receiving signal RX, which does not include noise pulses.

The hysteresis circuit 60 may be arranged between the preamplifier 31 and the main amplifier 32. Each of the preamplifier 31 and the main amplifier 32 do not have to be a differential type amplifier and may be a single output type amplifier.

Figure 10:
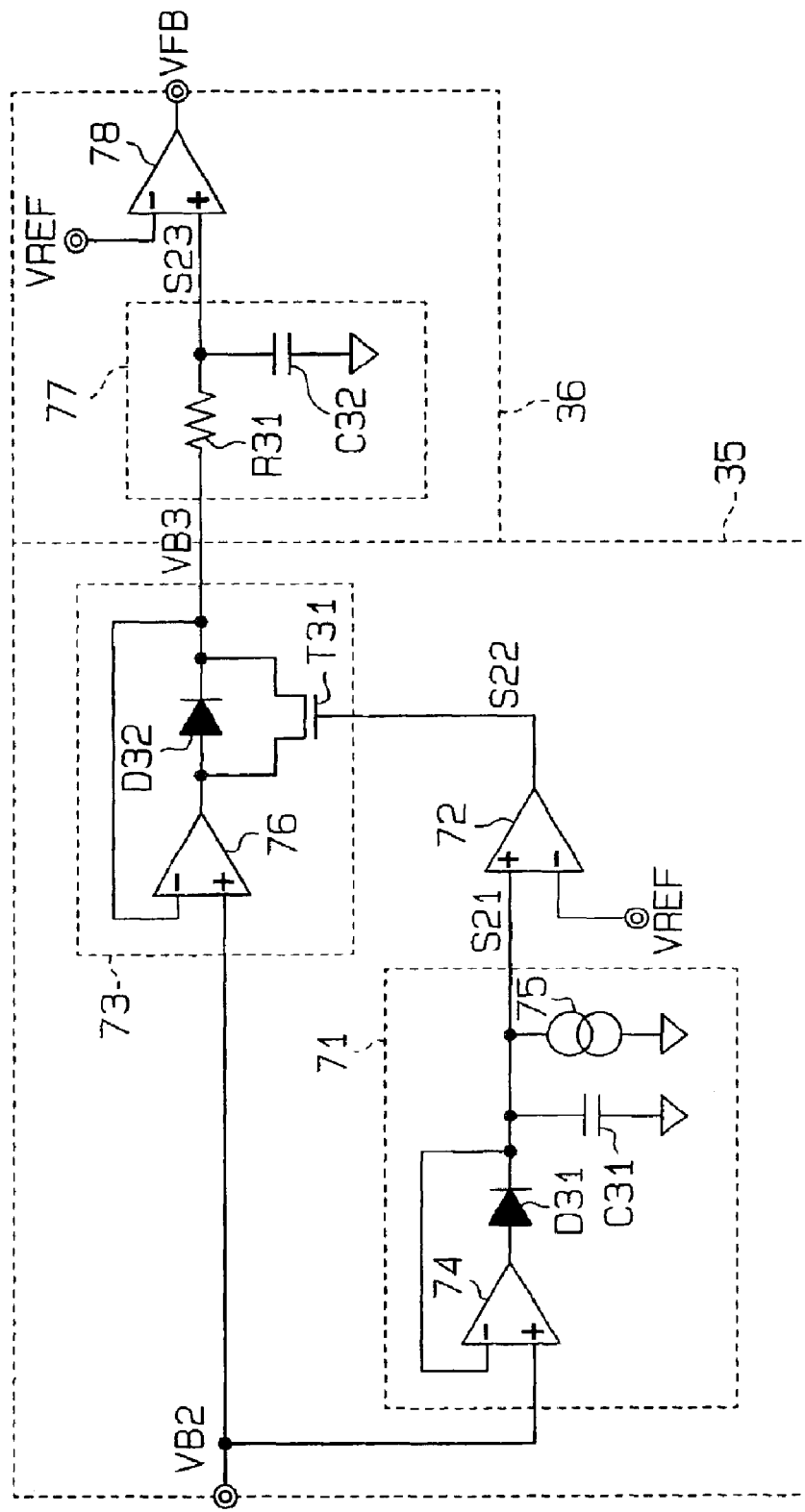
FIG. 10 is a circuit diagram of an amplitude restriction circuit and a DCFB circuit of the light receiving amplifier of FIG. 4.

FIG. 10 is a circuit diagram of the amplitude restriction circuit 35 and the DCFB circuit 36. The amplitude restriction circuit 35 includes a voltage holding circuit (peak hold circuit) 71, an amplifier 72, and a rectifying circuit 73. The DCFB circuit 36 includes a filter 77 and an amplifier 78.

The peak hold circuit 71 receives an amplified signal VB2 from the main amplifier 32 and generates a peak level hold signal S21 of the amplified signal VB2. The peak hold circuit 71 includes an amplifier 74, a diode D31, a capacitor C31, and a current source 75. The amplifier 74 has a plus input terminal for receiving the amplified signal VB2, a minus input terminal connected to the cathode of the diode D31, and an output terminal connected to the anode of the diode D31. The cathode of the diode D31 is connected to a low potential power supply via the capacitor C31 and the current source 75.

The amplifier 72 has a plus input terminal for receiving the peal level hold signal S21 of the peak hold circuit 71, a minus input terminal for receiving the reference voltage VREF, and an output terminal for outputting a control signal S22 corresponding to the potential difference between the plus input terminal and the minus input terminal.

The rectifying circuit 73 includes an amplifier 76, a transistor T31, and a diode D32. The amplifier 76 has a plus input terminal for receiving the amplified signal VB2, a minus input terminal connected to the cathode of the diode D32, and an output terminal connected to the anode of the diode D32. A transistor T31 is connected parallel to the diode D32. The transistor T31 has a gate for receiving the control signal S22 of the amplifier 72.

The rectifying characteristic of the rectifying circuit 73 is controlled by the peak hold circuit 71 and the amplifier 72. That is, when the transistor T31 is activated in response to the control signal S22, the two terminals of the diode D32 are short-circuited with each other, and the rectifying circuit 73 functions as a buffer circuit. Accordingly, as shown in FIG. 11, the rectifying circuit 73 generates an amplified signal VB3, the waveform of which is substantially the same as that of the amplified signal VB2. When the transistor T31 is deactivated in response to the control signal S22, the diode D32 rectifies the amplified signal VB2 and outputs an amplitude restricted signal VB3, the minus voltage of which is clipped.

Returning to FIG. 10, the filter 77 includes a resistor R31 and a capacitor C32. The filter 77 eliminates AC components from the amplified signal (or amplitude restriction signal) VB3, which is output from the amplitude restriction circuit 35, and generates a filtered signal S23. The amplifier 78 has a plus input terminal for receiving the filtered signal S23, a minus input terminal for receiving the reference voltage VREF, and an output terminal for outputting a current signal VFB, which corresponds to the potential difference between the plus input terminal and the minus input terminal.

Figure 12A:
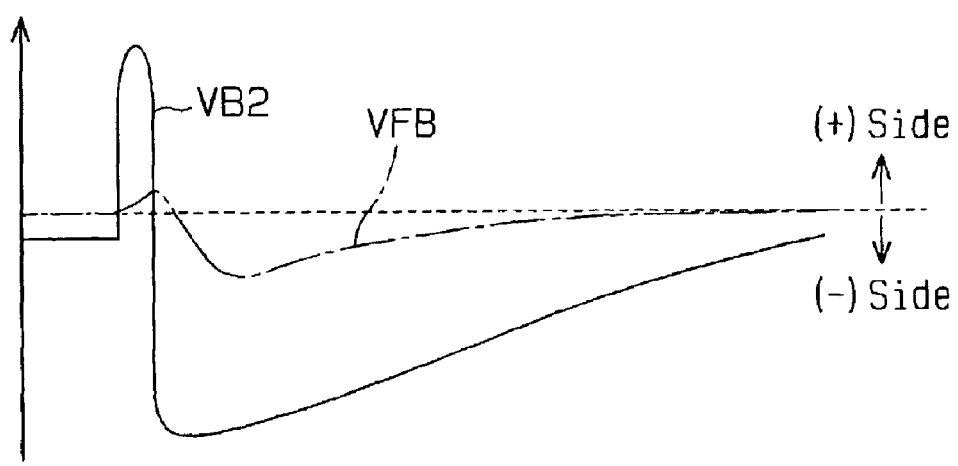
FIG. 12(a) is an output waveform diagram of a main amplifier of the light receiving amplifier of FIG. 4.
Figure 12B:
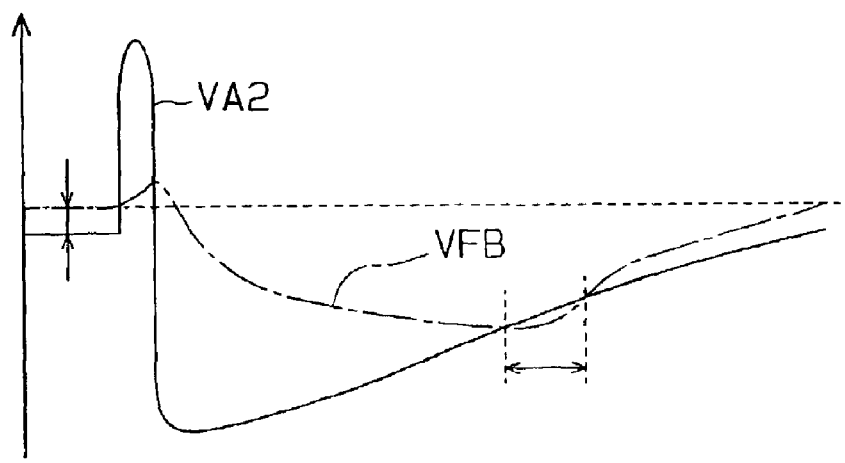
FIG. 12(b) is an output waveform diagram of a main amplifier of the light receiving amplifier of FIG. 1.

As shown in FIG. 12(a), when the voltage signal VB1 provided to the main amplifier 32 is relatively large, a current signal VFB, the minus voltage of which is clamped, is generated by the amplitude restriction circuit 35 and the DCFB circuit 36. This prevents the current signal VFB, which is provided from the DCFB circuit 36 to the main amplifier 32, from becoming lower than the amplified signal VB2, which is generated by the main amplifier 32. As a result, erroneous functioning of the main amplifier 32 is prevented. As shown in FIG. 12(b), when the prior art DCFB circuit 17 is used, the current signal VFB of the DCFB circuit 17 may become lower than the amplified signal VB2, which is generated by the main amplifier 14.

Figure 13:
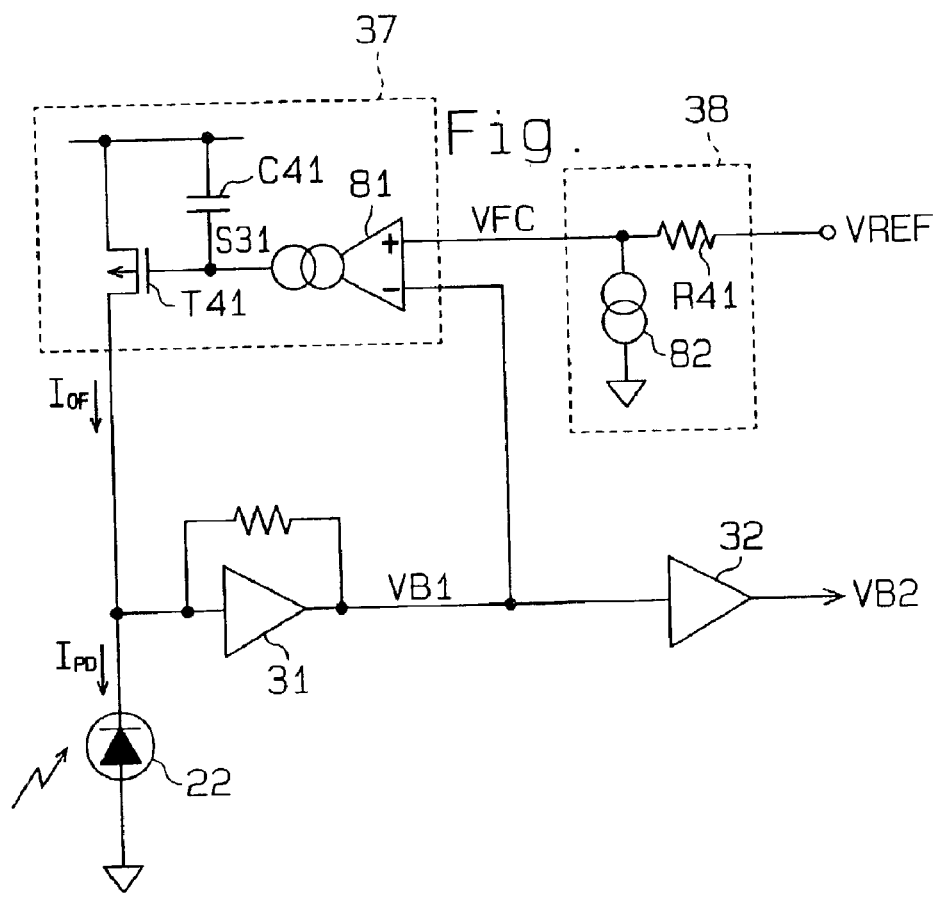
FIG. 13 is a circuit diagram of a DC light cancel circuit and offset circuit of the light receiving amplifier of FIG. 4.

FIG. 13 is a circuit diagram of the DC light cancel circuit 37 and the offset circuit 38. The DC light cancel circuit 37 includes an amplifier 81, a capacitor C41, and a transistor T41. The amplifier 81 includes a minus input terminal for receiving the voltage signal VB1 from the preamplifier 31, a plus input terminal for receiving an offset voltage signal VFC from the offset circuit 38, and an output terminal connected to a first terminal of the capacitor C41 and the gate of the transistor T41. A second terminal of the capacitor C41 is connected to the high potential power supply. The transistor T41, which is a p-channel MOS transistor, includes a source connected to the high potential power supply and a drain connected to the input terminal of the preamplifier 31.

The offset circuit 38 includes a resistor R41 and a current source 82. The resistor R41 has a first terminal for receiving the reference voltage VREF and a second terminal connected to the current source 82 via the current source 82. A second terminal of the resistor R41 is connected to a plus input terminal of the amplifier 81.

The offset circuit 38 generates the offset voltage signal VFC from the reference voltage VREF and provides the offset voltage signal to the DC light cancel circuit 37. The amplifier 81 generates an amplifier output signal S31 corresponding to the potential difference between the offset voltage signal VFC and the voltage signal VB1. The transistor T41 goes on and off in response to the amplifier output signal S31. When the transistor T41 goes on, an offset current IOF is supplied to the preamplifier 31. Accordingly, the DC light cancel circuit 37 does not supply the preamplifier 31 with the offset current IOF until the voltage of the voltage signal VB1 of the preamplifier 31 exceeds the offset voltage VFC.

The offset current IOF is set in the following manner.

When the current generated by the photodiode 22 from the received light is represented by Ipd, the current generated from DC light components such as sunlight is represented by Idc, and current generated from signal components is represented by ΔIpd, the following equation is satisfied.

$$Ipd = Idc + \Delta Ipd$$

The purpose of the DC light cancel circuit 37 is to supply the preamplifier 31 with only the current ΔIpd. Accordingly, the offset circuit 38 supplies the DC light cancel circuit 37 with the offset voltage VFC at a level that does not saturate the preamplifier 31 with the current Idc of the DC component.

One example will now be discussed. In the example, a 20KΩ resistor is connected between the input and output terminals of the preamplifier 31 that perform I-V conversion, the DC bias fluctuation tolerable amount is 0.2V, and the offset voltage VFC is 0.2V. In this case, an offset of Idc=10 μA (0.2V/20K) is given. Accordingly, the DC light cancel circuit 37 does not function until the condition of current Idc=10 μA is satisfied. Thus, the DC light cancel circuit 37 does not output the offset current IOF. Accordingly, the amount of noise included in the received current is extremely small. When the optical communication apparatus is used indoor, the DC component Idc is often 10 μA or less although this depends on the size of the photodiode 22. Accordingly, a communication is satisfactorily performed.

Figure 14:
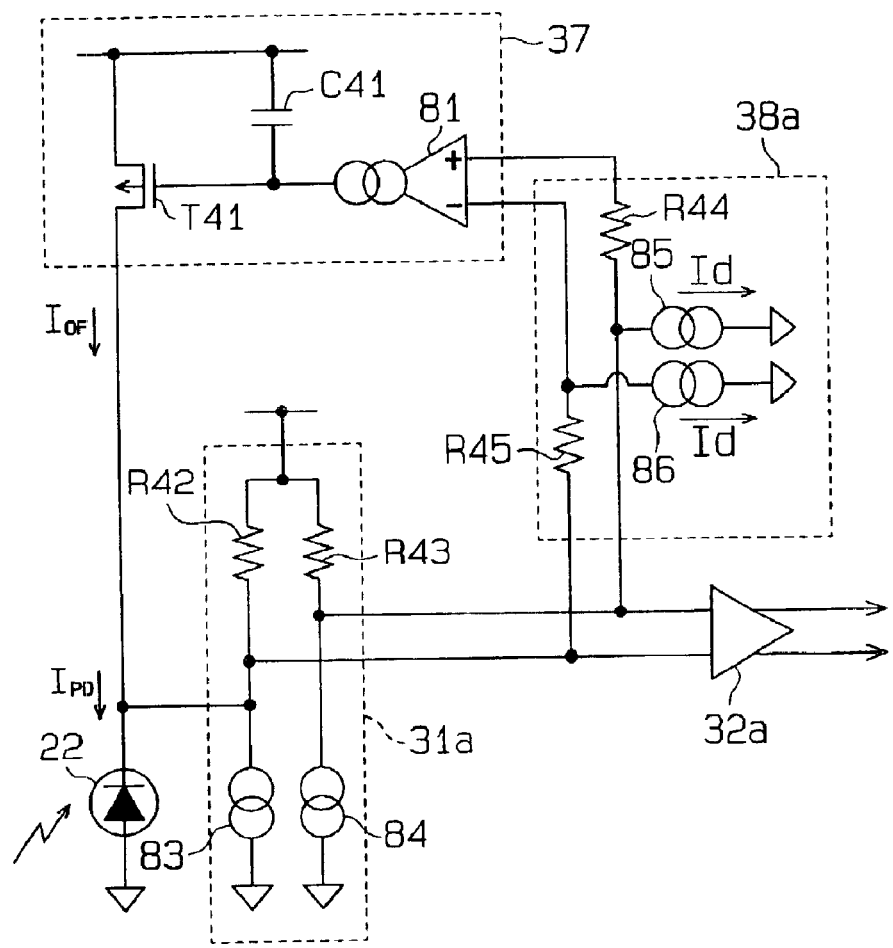
FIG. 14 is a circuit diagram of a modified example of the offset circuit.

As shown in FIG. 14, instead of the offset circuit 38, the present invention may be embodied in a light receiving amplifier that includes an offset circuit 38a. The light receiving amplifier includes a preamplifier 31a, which has a differential output, and a main amplifier 32a.

The preamplifier 31a includes a resistor R42 and a current source 83, which are connected in series between the high potential power source and the low potential power source. The preamplifier 31a also includes a resistor R43 and a current source 84, which are connected in series between the high potential power source and the low potential power source. The photodiode 22 is connected to a first node (first output terminal) between the resistor R42 and the current source 83. Complementary voltage signals are output from the first node and a second node (second output terminal) between the resistor R43 and the current source 84.

The offset circuit 83a includes resistors R44, R45 and current sources 85, 86. The resistors R44, R45 are connected between the first and second nodes of the preamplifier 31a and the plus and minus input terminals of the amplifier 81 of the DC light cancel circuit 37, respectively. Complementary voltage signals of the preamplifier 31a are provided to the amplifier 81 via the resistors R44, R45. The current source 85 is connected between a low potential power supply and a node between the resistor R44 and the second output terminal of the preamplifier 31a. The current source 86 is connected between the low potential power supply and a node between the resistor 45 and the minus input terminal of the amplifier 81.

The offset circuit 38a provides the DC light cancel circuit 37 with an offset voltage VFC (Rd×Id), which is determined by the resistance Rd of the resistors R44, R45 and the current Id of the current sources 85, 86.

Figure 15:
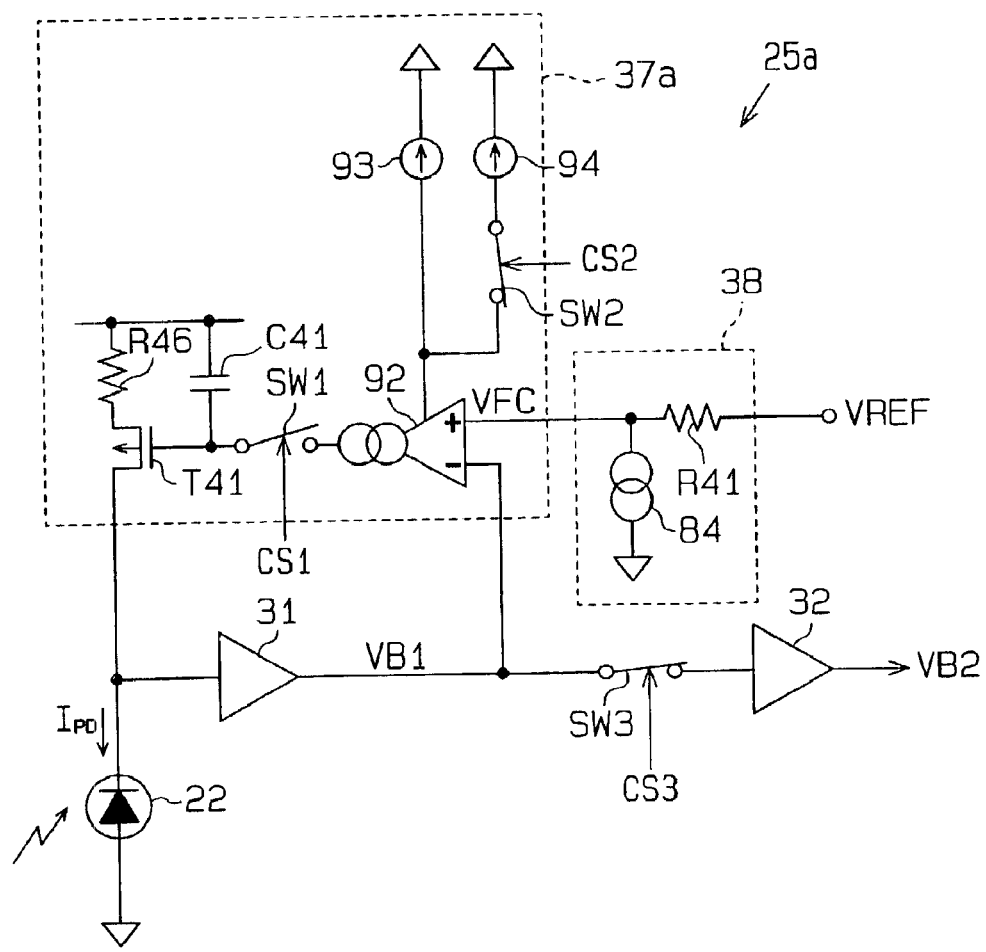
FIG. 15 is a circuit diagram of a first modified example of the DC optical cancel circuit.

As shown in FIG. 15, the DC light cancel circuit 37 may be replaced by a DC light cancel circuit 37a. The DC light cancel circuit 37a includes an amplifier 92, a capacitor C41, a transistor T41, a resistor R46, current sources 93, 94, and switches SW1, SW2. The amplifier 92 includes a minus input terminal for receiving the voltage signal VB1 of the preamplifier 31 and a plus input terminal for receiving the offset signal VFC of the offset circuit 38. The output terminal of the amplifier 92 is connected to the high potential power supply via the switch SW1 and the capacitor C41. The output terminal of the amplifier 92 is also connected to the gate of the transistor T41. The transistor T41 is preferably a p-channel MOS transistor. The p-channel MOS transistor has a source, which is connected to the high potential power supply via the resistor R46, and a drain, which is connected to the input terminal of the preamplifier 31. The amplifier 92 is connected to the current source 93. The amplifier 92 is also connected to the current source 94 via the switch SW2. A switch SW3 is connected between the main amplifier 32 and the preamplifier 31.

Figure 17:
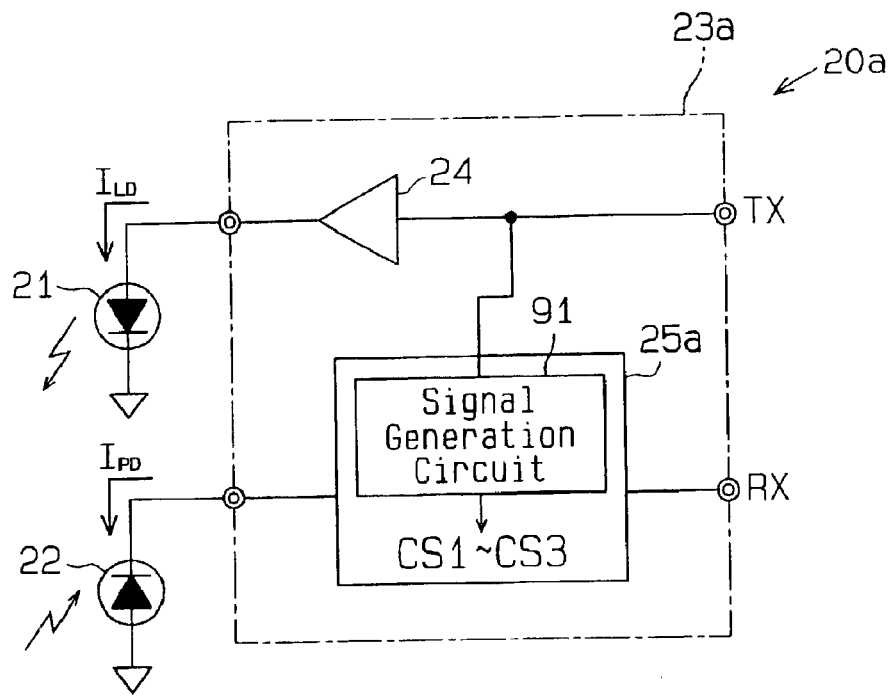
FIG. 17 is a schematic block diagram of a modified example of the optical communication apparatus.

The DC light cancel circuit 37a is used in a light receiving amplifier 25a of an optical communication apparatus 20a, which is shown in FIG. 17. The optical communication apparatus 20a includes a light-emitting diode 21, a photodiode 22, a light-transmitting amplifier 24, and a light receiving amplifier 25a.

Figure 16:
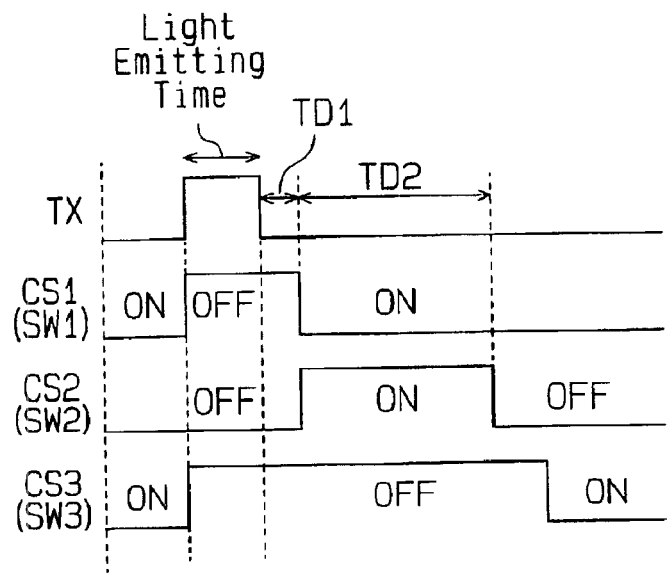
FIG. 16 is a waveform diagram illustrating the operation of the DC light cancel circuit of the DC optical cancel circuit of FIG. 15.

Referring to FIG. 16, the light receiving amplifier 25a includes a signal generation circuit 91 for generating control signals CS1–CS2 in response to the transmitting signal TX. More specifically, the signal generation circuit 91 generates a first control signal CS1 for deactivating the first switch SW1 during the period in which the transmitting signal is ON and during a predetermined first delay period TD1. The signal generation circuit 91 generates the second control signal CS2, which activates the second switch SW2, for a predetermined second delay time TD2 after the first delay time TD1 elapses from when the transmitting signal TX goes off (i.e., after the first switch SW1 goes on). The signal generation circuit 91 further generates the third control signal CS3, which deactivates the third switch SW3, until the light receiving amplifier 25a stabilizes from when the transmitting signal TX goes on.

Such control solves problems caused by the light of the light-emitting diode 21 during transmission in half duplex optical space communication. That is, the light of the light-emitting diode 21 is received by the photodiode 22. Thus, the photodiode 22 receives a large amount of light. In this state, when a state of transmitting signals is shifted to a state of receiving signals, it may take time for the light receiving amplifier to return to a normal state.

During transmission (i.e., the period during which the transmitting signal TX is ON) and until there is no influence of the light emitted from the light-emitting diode 21, the first switch SW1 is deactivated and the DC light cancel circuit 37a is de-activated. Subsequently, the second switch SW2 is activated to supply the amplifier 92 with current, the amount of which is greater than normal (i.e., when the second switch SW2 is deactivated), the charging and discharging of the capacitor C41 is performed at a high speed, and the potential difference (offset) between the input terminal and output terminal of the preamplifier 31 is eliminated within a short period of time. Further, the third switch SW3 is deactivated to maintain the receiving signal RX at a logic level of a silent state until the light receiving amplifier 25a stabilizes. In the light receiving amplifier 25a, the cancel time of the DC component when shifting from a state of transmitting signals to a state of receiving signals is shortened. The third switch SW3 may be eliminated. Further, the third switch SW3 may be connected to the input or the output of the comparator 33.

Figure 18:
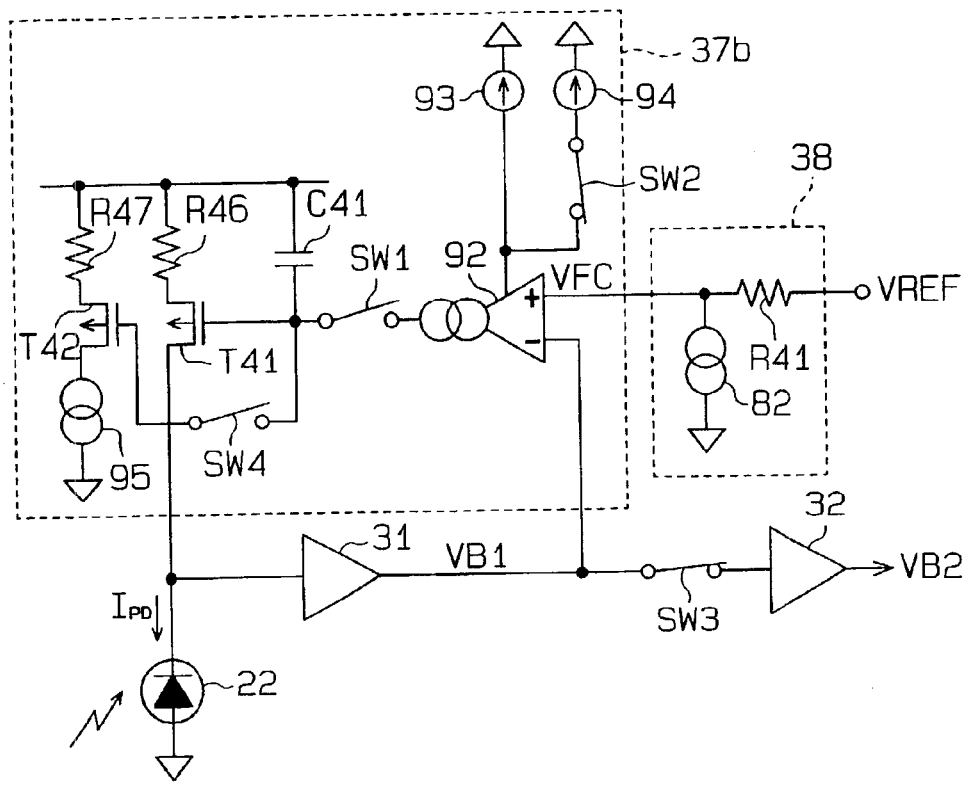
FIG. 18 is a circuit diagram of a second modified example of the DC optical cancel circuit.

As shown in FIG. 18, the DC light cancel circuit 37a may be replaced by a DC light cancel circuit 37b.

In addition to the configuration of the DC light cancel circuit 37a, the DC light cancel circuit 37b further includes a fourth switch SW4, a resistor R47, a second transistor T42, and a current source 95. The fourth switch SW4 is connected between the gate of the first transistor T41 and the gate of the second transistor T42. The second transistor T42, which is a p-channel MOS transistor, includes a source connected to the high potential power supply via the resistor R47 and a drain connected to the low potential power supply via the current source 95.

Figure 19:
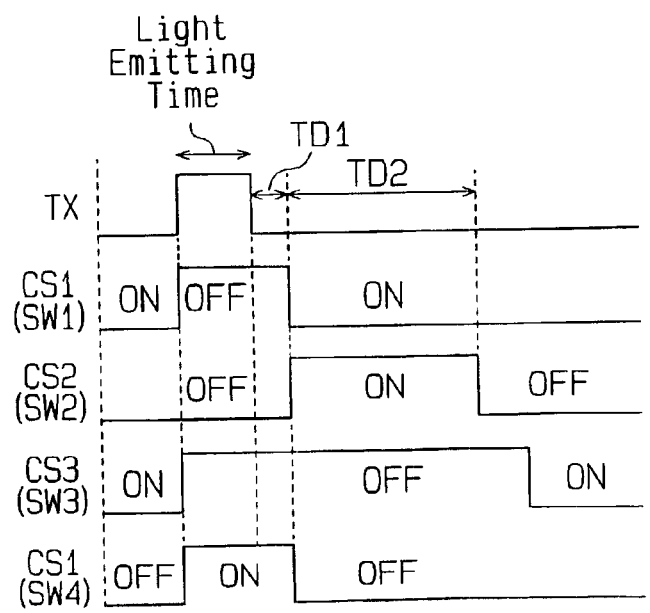
FIG. 19 is a waveform diagram illustrating the operation of the DC light cancel circuit of FIG. 18.

In response to the first control switch SW1, the fourth switch SW4 goes on an off in a manner opposite to the first switch SW1. For example, as shown in FIG. 19, the first switch SW1 goes on when the first control signal CS1 goes low and goes off when the first control signal CS1 goes high. The fourth switch SW4 goes off when the first control signal CS1 goes low, and goes on when the first control signal CS1 goes high. The control signal of the fourth switch SW4 may be generated separately from the first control signal CS1. Idle current from the current source 95 flows through the second transistor T42. Based on the current value of the idle current, a gate-source voltage VGS is generated at the second transistor T42.

When the light-emitting diode 21 is emitting light, the first switch SW1 is deactivated and the fourth switch SW4 is activated. In this state, a voltage based on the gate-source voltage VGS of the second transistor T42 is applied to the gate of the first transistor T41. The applied voltage prevents the gate voltage of the first transistor T41 from having high impedance.

When the light-emitting diode 21 stops emitting light and the delayed time TD1 elapses, the first switch SW1 is activated and the fourth switch SW4 is deactivated. The amplifier 92 supplies the gate of the first transistor T41 with current corresponding to the potential difference of the input terminal. In this state, a potential based on the gate-source voltage VGS is applied to the gate of the first transistor T41. Thus, the gate source voltage VGS of the transistor T41 is set at the desired voltage within a short period of time. That is, the DC light cancel circuit 37b returns to the normal state within a short period of time.

Figure 20:
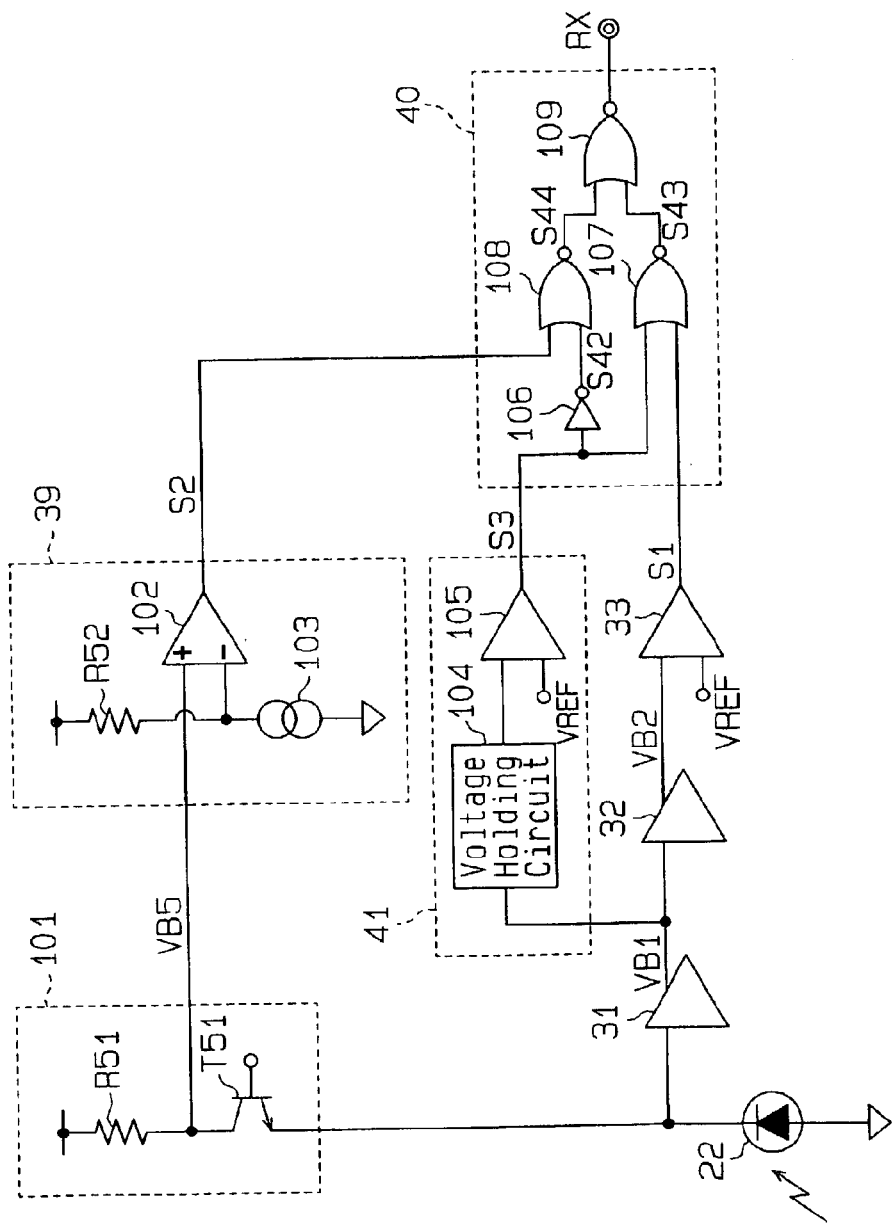
FIG. 20 is a circuit diagram of a clamp detection circuit, a large signal detection circuit, and a pulse synthesizing circuit of the light receiving amplifier of FIG. 4.

FIG. 20 is a circuit diagram of the clamp detection circuit 39, the pulse synthesizing circuit 40, and the large signal detection circuit 41. FIG. 20 shows a clamp circuit 101, which is included in the preamplifier 31. The clamp circuit 101 includes a resistor R51 and a transistor T51. A clamp bias is supplied to the base of the transistor T51. A node between the resistor R51 and the transistor T51 is connected to the clamp detection circuit 39.

The clamp detection circuit 39 includes a comparator 102. The clamp detection circuit 39 also includes a resistor R52 and a current source 103 connected in series between the high potential power source and the low potential power source. The comparator 102 includes a plus input terminal for receiving a signal VB5 corresponding to the operating state of the clamp circuit 101, a minus input terminal connected to a node between the resistor R52 and the current source 103, and an output terminal connected to the pulse synthesizing circuit 40.

The clamp detection circuit 39 generates second receiving signal S2 according to the potential difference between the signal VB5 corresponding to the operating state of the clamp circuit 101 and the reference voltage that is determined by the resistor R52 and the current source 103.

The large signal detection circuit 41 includes a voltage holding circuit (peak hold circuit) 104 and a comparator 105. The peak hold circuit 104 receives the voltage signal VB1 of the preamplifier 31 and generates a peak level hold signal VB1, which is a signal that holds the voltage signal VB1 at the peak level. The comparator 105 receives the peak level hold signal S41 and the reference signal VREF and generates a detection signal S3, which is in accordance with the potential difference between the peak level hold signal S41 and the reference voltage VREF.

The pulse synthesizing circuit 40 includes an inverter circuit 106 and three NOR circuits 107, 108, 109. The inverter circuit 106 generates an inverted signal S42 of the detection signal S3. The first NOR circuit 107 receives the first receiving signal S1 and the detection signal S3 to generate a NOR signal S43 of the first receiving signal S1 and the detection signal S3. The second NOR circuit 108 receives the second receiving signal S2 and the inverted signal S42 of the inverter circuit 106 to generate a NOR signal S44 of the second receiving signal S2 and the inverted signal S42. The third NOR circuit 109 receives the NOR signals S43, S44 of the first and second NOR circuits 107, 108 to generate a NOR signal S4 of the signals S43, S44.

Figure 21:
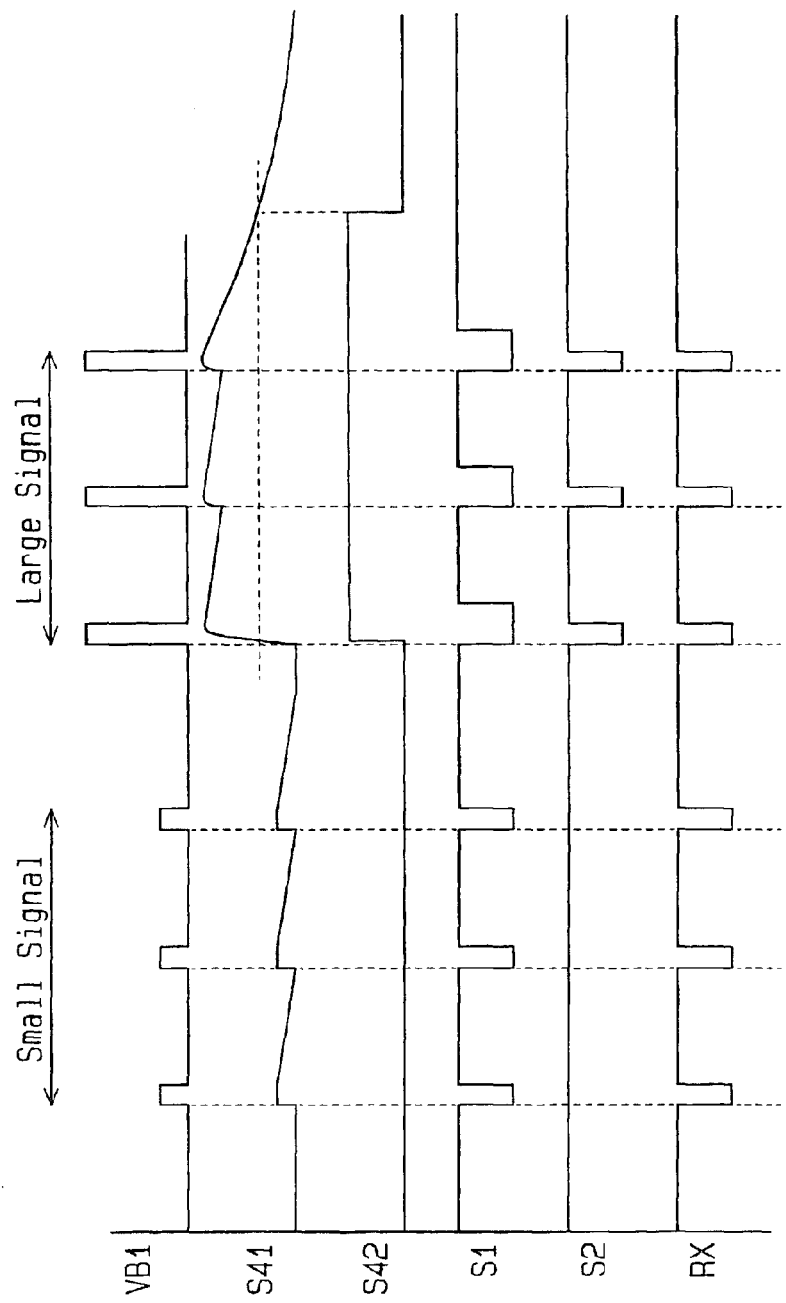
FIG. 21 is a waveform diagram illustrating the clamp detection circuit, the large signal detection circuit, and the pulse synthesizing circuit of FIG. 20.

The operation of the clamp detection circuit 39, the pulse synthesizing circuit 40, and the large signal detection circuit 41 will now be discussed with reference to FIG. 21.

When the voltage signal VB1 of the preamplifier 31 is relatively small and the peak level hold signal S41 does not exceed the reference voltage VREF, the large signal detection circuit 41 generates the detection signal S3 at a low level. In this state, the first receiving signal S1 of the comparator 33 has a pulse width that satisfies the regulated standard. The pulse synthesizing circuit 40 generates a synthesizing signal S4, which has a waveform that is substantially the same as the first receiving signal S1, in response to the detection circuit S3. The logic maintaining circuit 34 generates the receiving signal RX, which has a waveform that is substantially the same as the synthesizing signal S4.

When the voltage signal VB1 of the preamplifier 31 is relatively large and the peak level hold signal S41 exceeds the reference voltage VREF, the large signal detection circuit 41 generates the detection signal S3 at a high level. In this state, the trailing of the first receiving signal S1 of the comparator 33 causes the pulse width to be greater than or equal to the regulated standard, and the second receiving signal S2 of the clamp detection circuit 39 has a pulse width that satisfies the regulated standard. The pulse synthesizing circuit 40 generates the synthesizing signal S4, which has a waveform that is substantially the same as the second receiving signal S2, in response to the detection circuit S3. The logic maintaining circuit 34 generates the receiving signal RX, which has a waveform that is substantially the same as the synthesizing signal S4.

The optical communication apparatus 20 of the preferred embodiment has the advantages described below.

(1) The logic maintaining circuit 34 receives the first receiving signal S1 from the comparator 33. When the level of the first receiving signal S1 shifts, the logic maintaining circuit maintains the first receiving signal S1 at that level for a predetermined time to generate the receiving signal RX. As a result, noise pulses are prevented from appearing in the receiving signal RX. Thus, internal circuits of the optical communication apparatus are not affected by noise.

(2) The logic maintaining circuit 34 has the integration circuit 51. Accordingly, pulses that are less than or equal to the time constant of the integration circuit 51 (i.e., pulses that are less than the regulated standard) are eliminated.

(3) In accordance with the level of the amplified signal VB2 of the main amplifier 32, the amplitude restriction circuit 35 performs an amplification operation to generate the amplified signal or a rectifying operation to generate the amplitude restriction signal VB3. The DCFB circuit 36 feeds back current, which is in accordance with the signal VB3, to the main amplifier 32. Accordingly, fluctuation of the feedback amount relative to the amplified signal VB2 of the main amplifier 32 is suppressed, and the DC offset of the main amplifier 32 is effectively canceled by the DCFB circuit 36.

(4) The offset circuit 38 provides the DC light cancel circuit 37 with an offset. The DC light cancel circuit 37 does not function until current having a DC component corresponding to the provided offset flows. Accordingly, the DC light cancel circuit 37 does not cancel the DC component until the predetermined DC component is generated. This prevents noise from increasing and prevents the signal receiving sensitivity from decreasing.

(5) The clamp detection circuit 39 generates the second receiving signal S2 based on the current of the clamp circuit 101 in the preamplifier 31. The pulse synthesizing circuit 40 synthesizes the first receiving signal S1 and the second receiving signal S2, which are provided to the comparator 33, to generate the receiving signal RX. The second receiving signal S2 is not affected by the received light and has a small trailing. Accordingly, by using the first receiving signal S1 when the amount of the received light is small and by using the second receiving signal S2 when the amount of the received light is large prevents the pulses of the receiving signal RX from being widened.

It should be apparent to those skilled in the art that the present invention may be embodied in many other specific forms without departing from the spirit or scope of the invention. Particularly, it should be understood that the invention may be embodied in the following forms.

The large signal detection circuit 41 may determine the amount of the received light (the input signal of the light receiving amplifier 25) from the voltage signal of the preamplifier 31 and the amplified signal VB2 of the main amplifier 32.

The receiving circuit 25 may be modified as required in the following manner.

The receiving circuit may include the logic maintaining circuit 34.

The receiving circuit may include the amplitude restriction circuit 35.

The receiving circuit may include the offset circuit 38.

The receiving circuit may include the clamp detection circuit 39, the pulse synthesizing circuit 40, and the large signal detection circuit 41.

The receiving circuit may include the logic maintaining circuit 34 and the amplitude restriction circuit 35.

The receiving circuit may include the logic maintaining circuit 34 and the offset circuit 38.

The receiving circuit may include the logic maintaining circuit 34, the clamp detection circuit 39, the pulse synthesizing circuit 40, and the large signal detection circuit 41.

The receiving circuit may include the logic maintaining circuit 34, the amplitude restriction circuit 35, and the offset circuit 38.

The receiving circuit may include the logic maintaining circuit 34, the amplitude restriction circuit 35, the clamp detection circuit 39, the pulse synthesizing circuit 40, and the large signal detection circuit 41.

The receiving circuit may include the amplitude restriction circuit 35 and the offset circuit 38.

The receiving circuit may include the amplitude restriction circuit 35, the clamp detection circuit 39, the pulse synthesizing circuit 40, and the large signal detection circuit 41.

The receiving circuit may include the offset circuit 38, the clamp detection circuit 39, the pulse synthesizing circuit 40, and the large signal detection circuit 41.

Instead of the photodiode 22, other light receiving devices may be used.

Instead of the light-emitting diode 21, other light-emitting devices such as a semiconductor laser may be used.

The present invention may be embodied in an optical communication apparatus having an external terminal for connecting a light-emitting diode and a photodiode.

The present invention may be embodied in a light receiving apparatus that has only the light receiving amplifier 25.

Figure 22:
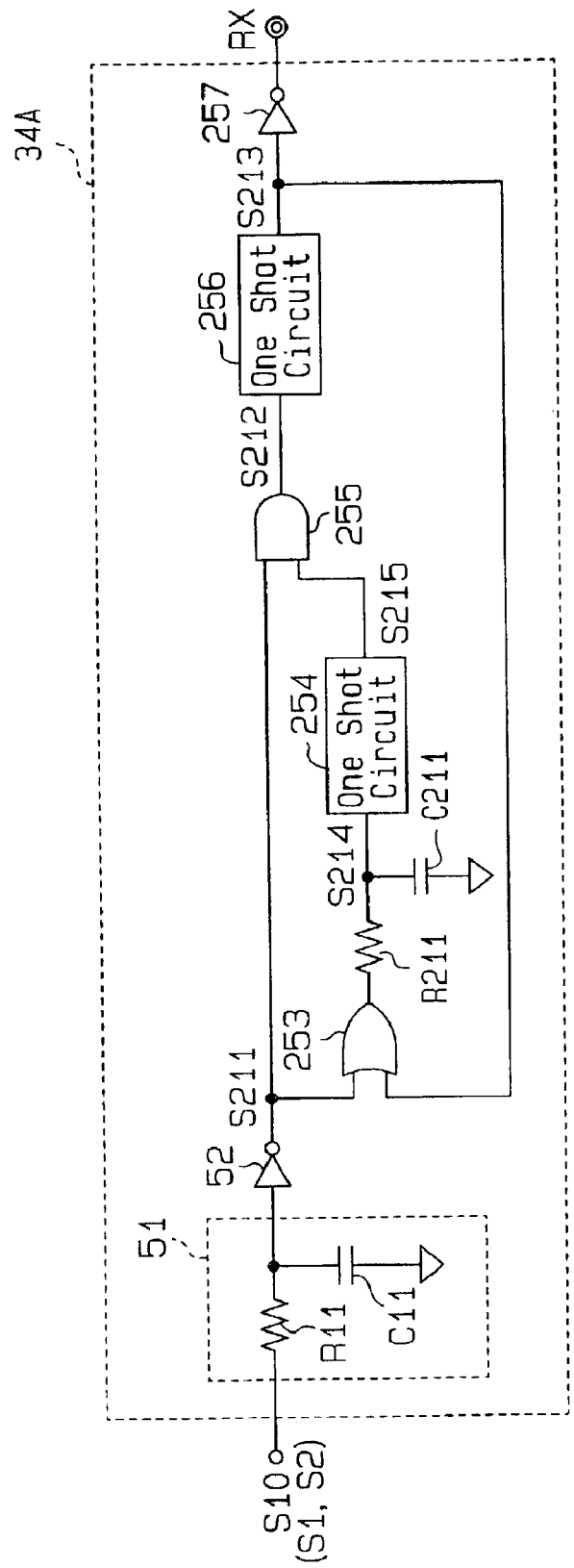
FIG. 22 is a modified example of the logic maintaining circuit of FIG. 5.

The logic maintaining circuit 34 may be modified as a logic maintaining circuit 34A shown in FIG. 22. The logic maintaining circuit 34A includes the integration circuit 51, the inverter circuit 52, one shot circuits 254, 256, a resister R211, a capacitor C211, an OR circuit 253, an AND circuit 255, and an inverter circuit 257.

The one shot circuit 256 receives an AND logic signal S212 from the AND circuit S212 and generates a one shot signal S213, which has a first predetermined pulse width, in response to an up edge trigger of the AND logic signal S212. The inverter 257 receives the one shot signal S213 and generated an inverted signal as a receiving signal RX. The receiving signal RX is maintained at a predetermined level (low level in FIG. 23) for a predetermined period that corresponds to at least the pulse width of the one shot signal S213.

The OR circuit 253 receives the one shot signal S213 and the inverted signal S211 output from the inverter 52 and generates an OR logic signal which is delayed by the resister R211 and the capacitor C11, so that a delayed signal S214 is provided to the one shot circuit 254. The one shot circuit 254 generates a one shot signal S215 low having a combined pulse width of an input pulse width of the inverted signal S214 and a second predetermined pulse width. The second predetermined pulse width is generated when the inverted signal S214 is deasserted. In other words, the one shot circuit 254 generates the second predetermined pulse width in response to a down edge trigger of the inverted signal S214, which prevents the AND logic signal S212 from asserting during the time corresponding to the second predetermined pulse width.

The present examples and embodiments are to be considered as illustrative and not restrictive and the invention is not to be limited to the details herein, but may be modified within the scope and equivalence of the claims.

What is claimed is:

1. A receiving circuit comprising:
    an amplifier for generating a receiving voltage signal;
    a comparator for generating a binary signal with the receiving voltage signal; and
    a logic maintaining circuit for receiving the binary signal and maintaining the binary signal at a shifted level for a predetermined period after the level of the binary signal is shifted, wherein the logic maintaining circuit includes a one shot circuit for generating a pulse signal having a predetermined pulse width in response to the shifting of the binary signal.

2. The receiving circuit according to claim 1, wherein the logic maintaining circuit includes a logic circuit connected to the one shot circuit for synthesizing the binary signal and the pulse signal to generate a receiving signal.

3. The receiving circuit according to claim 1, wherein the logic maintaining circuit includes an integration circuit for generating an integration signal of the binary signal.

4. The receiving circuit according to claim 3, wherein the integration circuit has a hysteresis of the integration signal.

5. The receiving circuit according to claim 1, wherein the logic maintaining circuit includes:
    an integration circuit for generating an integration signal of the binary signal;
    a first one shot circuit for generating a first pulse signal having a first predetermined pulse width based on the integration signal;
    a first signal synthesizing circuit connected to the first one shot circuit for synthesizing the integration signal and the first pulse signal to generate a synthesized signal;
    a second one shot circuit for receiving the synthesized signal and generating a second pulse signal that has a second predetermined pulse width; and a second signal synthesizing circuit for receiving the synthesizing signal and the second pulse signal to generate a receiving signal.

6. The receiving circuit according to claim 5, wherein the integration circuit has a hysteresis of the integration signal.

7. The receiving circuit according to claim 1, wherein the amplifier includes:
   a first amplifier for converting a receiving current signal to the receiving voltage signal;
   a second amplifier connected to the first amplifier for amplifying the receiving voltage signal to generate an amplified signal, the receiving circuit further comprising;
   a hysteresis circuit connected between the second amplifier and the comparator to provide the comparator with the amplified signal having the hysteresis.

8. The receiving circuit according to claim 7, wherein the hysteresis circuit provides the comparator with the amplified signal having two hysteresis in accordance with the period during which a logic is maintained.

9. The receiving circuit according to claim 1, wherein the logic maintaining circuit includes:
   an integration circuit for generating an integration signal of the binary signal;
   a first signal synthesizing circuit for synthesizing the integration signal and a one shot signal to generate a first synthesized signal;
   a first one shot circuit connected to the first signal synthesizing circuit for generating a receiving signal that has a first predetermined pulse width;
   a second signal synthesizing circuit connected to the first one shot circuit for synthesizing the integration signal and the receiving signal to generated a second synthesized signal; and
   a second one shot circuit connected to the first and second synthesizing circuits for generating the one shot signal having a combined pulse width of a pulse width of the integration signal and a second predetermined pulse width.

10. A receiving circuit comprising:
    a first amplifier for converting a receiving current signal to a receiving voltage signal;
    a second amplifier connected to the first amplifier for amplifying the receiving voltage signal to generate a first amplified signal;
    a comparator connected to the second amplifier for generating a receiving signal from the first amplified signal;
    an amplitude restriction circuit connected to the second amplifier for generating a second amplified signal when the first amplified signal is smaller than a predetermined value and generating a rectified signal when the first amplified signal is smaller than the predetermined value; and
    a feedback circuit connected between the second amplifier and the amplitude restriction circuit for generating a feedback signal that is fed back to the second amplifier based on the rectified signal so that the feedback signal suppresses fluctuation of the feedback amount of the feedback circuit.

11. A receiving circuit comprising:
    a first amplifier for converting a receiving current signal to a receiving voltage signal;
    a second amplifier connected to the first amplifier for amplifying the receiving voltage signal to generate a first amplified signal;
    a comparator connected to the second amplifier for generating a receiving signal from the first amplified signal;
    an amplitude restriction circuit connected to the second amplifier for generating a second amplified signal or a rectified signal in accordance with the level of the first amplified signal; and
    a feedback circuit connected between the second amplifier and the amplitude restriction circuit for generating a feedback signal that is fed back to the second amplifier based on the second amplified signal or the rectified signal, wherein the amplitude restriction circuit includes:
    a rectifying circuit having a rectifying device and a switching device connected parallel to the rectifying device to switch between an amplifying operation and a rectifying operation; and
    a control circuit for generating a control signal that controls the switching device in accordance with the second amplified signal.

12. The receiving circuit according to claim 11, wherein the control circuit includes:
    a voltage holding circuit for holding a peak voltage of the second amplified signal to generate a peak hold signal; and
    a comparator connected between the voltage holding circuit and the switching circuit to compare the peak hold signal and a reference voltage to generate the control signal.

13. A receiving circuit comprising:
    a first amplifier for converting a receiving current signal to a receiving voltage signal;
    a second amplifier connected to the first amplifier for amplifying the receiving voltage signal and generating an amplified signal;
    a comparator connected to the second amplifier for generating a receiving signal from the amplified signal;
    a cancel circuit connected to the first amplifier for generating a cancel signal that cancels a DC component of the receiving current signal based on the receiving voltage signal; and
    an offset circuit connected to the cancel circuit for giving an offset to the receiving voltage signal provided to the cancel circuit.

14. The receiving circuit according to claim 13, further comprising a control circuit for deactivating the cancel circuit during a predetermined period.

15. The receiving circuit according to claim 14, wherein the control circuit deactivates the cancel circuit when a transmitting signal is activated.

16. The receiving circuit according to claim 15, wherein the cancel circuit increases its current driving capacity for a predetermined time when the cancel circuit is activated.

17. The receiving circuit according to claim 14, wherein the cancel circuit includes:
    a first transistor for generating current to cancel a DC component of the receiving current signal; and
    a second transistor connected parallel to the first transistor, wherein a gate potential of the second transistor is applied to the gate of the first transistor when the cancel circuit is deactivated.

18. A receiving circuit comprising:
    a first amplifier for converting a receiving current signal to a receiving voltage signal;
    a second amplifier connected to the first amplifier for amplifying the receiving voltage signal and generating an amplified signal;

a comparator connected to the second amplifier for generating a first receiving signal from the amplified signal;

a clamp detection circuit for generating a second receiving signal having a pulse corresponding to current that flows through the first amplifier; and a pulse synthesizing circuit connected to the comparator and the clamp detection circuit for synthesizing the first receiving signal and the second receiving signal to generate a third receiving signal.

19. The receiving circuit according to claim 18, further comprising:

a large signal detection circuit connected to the first amplifier and the pulse synthesizing circuit for comparing the receiving voltage signal with a reference voltage to generate a detection signal, wherein the pulse synthesizing circuit generates the third receiving signal that corresponds to one of the first receiving signal and the second receiving signal in accordance with the detection signal.

20. The receiving circuit according to claim 19, wherein the large signal detection circuit includes:

a voltage holding circuit for holding a peak voltage of the receiving voltage signal to generate a held voltage signal; and a comparator connected to the voltage holding circuit for comparing the held voltage signal with the reference voltage to generate the detection signal.

21. A receiving circuit comprising:

a first amplifier for converting a receiving current signal to a receiving voltage signal;

a second amplifier connected to the first amplifier for amplifying the receiving voltage signal and generating a first amplified signal;

a comparator connected to the second amplifier for generating a first receiving signal from the first amplified signal;

a clamp detection circuit for generating a second receiving signal having a pulse corresponding to current that flows through the first amplifier;

a pulse synthesizing circuit connected to the comparator and the clamp detection circuit for synthesizing the first receiving signal and the second receiving signal to generate a third receiving signal;

a logic maintaining circuit connected to the pulse synthesizing circuit for maintaining the third receiving signal at a shifted level for a predetermined period after the level of the third receiving signal is shifted;

a cancel circuit connected to the first amplifier for generating a cancel signal that cancels a DC component of the receiving current signal based on the receiving voltage signal;

an offset circuit connected to the cancel circuit for giving an offset to the receiving voltage signal provided to the cancel circuit;

an amplitude restriction circuit connected to the second amplifier for generating a second amplified signal or a rectified signal in accordance with the level of the first amplified signal; and a feedback circuit connected between the second amplifier and the amplitude restriction circuit for generating a feedback signal that is fed back to the second amplifier based on the second amplified signal or the rectified signal.

22. The receiving circuit according to claim 21, further comprising:

a large signal detection circuit connected to the first amplifier and the pulse synthesizing circuit for comparing the receiving voltage signal with a reference voltage to generate a detection signal, wherein the pulse synthesizing circuit generates the third receiving signal that corresponds to one of the first receiving signal and the second receiving signal in accordance with the detection signal.

* * * * *